（12） United States Patent
Roy et al.

(10) Patent No.: US 8,981,096 B2
(45) Date of Patent: Mar. 17, 2015

(54) NICKEL COMPLEXES FOR FLEXIBLE TRANSISTORS AND INVERTERS

(75) Inventors: Vellaisamy A. L. Roy, Hong Kong (CN); Zong-Xiang Xu, Hong Kong (CN); Paul Kim Ho Chu, Hong Kong (CN); Tat Kun Kwok, Hong Kong (CN)

(73) Assignee: City University of Hong Kong, Kowloon (HK)

( * ) Notice: Subject to any disclaimer, the term of this patent is extended or adjusted under 35 U.S.C. 154(b) by 877 days.

(21) Appl. No.: 13/097,656

(22) Filed: Apr. 29, 2011

(65) Prior Publication Data

US 2012/0276687 A1   Nov. 1, 2012

(51) Int. Cl.
C07D 241/38   (2006.01)
H01L 51/00   (2006.01)
H01L 51/05   (2006.01)

(52) U.S. Cl.
CPC ........ H01L 51/0084 (2013.01); H01L 51/0051 (2013.01); H01L 51/0533 (2013.01); H01L 51/0558 (2013.01)
USPC ............................ 544/408; 544/344; 546/257

(58) Field of Classification Search
CPC .................................................. C07D 241/38
USPC .................................. 544/344, 408; 546/257
See application file for complete search history.

(56) References Cited

FOREIGN PATENT DOCUMENTS

JP   2009-260157 A   4/2008

OTHER PUBLICATIONS

Theriot et al. "Metal complexes of 2,3-quinoxalinedithiol." Journal of Inorganic and Nuclear Chemistry, 1969, 31(10), 3133.
Mukhopadhyay et al. "Nickel(II) and -(III) complexes with NiS4 environments: electron paramagnetic resonance and electrochemical studies." Journal of the Chemical Society, Dalton Transactions: Inorganic Chemistry 1993, 7, 1159.
Simao et al. "Charge transfer salts based on Cu(qdt)2, Ni(qdt)2 and Au(qdt)2 anions." Synthetic Metals 1999, 102, 1613-1614.
Fendley et al. "Frequency dependence of the electrical properties of coordination complexes of transition metals.". Journal of the Chemical Society, Faraday Transactions 1: Physical Chemistry in Condensed Phases 1973, 69, 1213.
Bigoli et al. "[Ni(R2pipdt)2](BF4)2 (R2pipdt=1,4-disubstituted-piperazine-3,2-dithione) as useful precursors of mixed-ligand dithiolenes of interest for non-linear optics." Chemical Communications 2001, 21, 2246.
Pignedoli et al. "Crystal and molecular structure of tetraethylammonium bis(2,3-quinoxalinedithiolato)nickelate(II) dihydrate, [(C2H5)4N]2[C6H4N2C2S2]2Ni.2H2O." Acta Crystallographica, Section B: Structural Crystallography and Crystal Chemistry 1974, B30, 2181.

Taguchi et al. "Comparison of p-type and n-type organic field-effect transistors using nickel coordination compounds." Chemical Physics Letters 2006, 421, 395.
Rignedoli et al. "A comparative study of the cationic, neutral and anionic nickel(II) complexes of quinoxaline-2,3-dithiol." Journal of Inorganic and Nuclear Chemistry, vol. 38, Issue 11, 1976, pp. 1963-1966.
Mikhailov "From novel complexing conditions to novel coordination compounds of nickel(II) with dithiooxamide and its bulky analogs." Transition Metal Chemistry (London) 1996, 21, 363.
Ra Clark et al. "Preparation and properties of a series of conducting metal complexes based on 2,3-dithiolatoquinoxaline, 2,3,5,6-tetrathiolatopyrazine and 2,3,7,8-tetrathiolatobis[1,4]dithiino-[2,3-b:2',3'-e]pyrazine." Synthetic Metals 1988, 25, 227.
Anthopolous et al. "Air-stable complementary-like circuits based on organic ambipolar transistors." Advanced Materials 2006, 18, pp. 1900-1904.
Becher et al. "Sodium 2-methyl-2-propylthiolate, a versatile sulfur reagent. Preparation of protected polysulfur ligands and their nickel(II) complexes." Inorganica Chimica Acta vol. 121, Issue 1, Nov. 3, 1986, pp. 23-26.

(Continued)

Primary Examiner — Douglas M Willis
(74) Attorney, Agent, or Firm — Amin, Turocy & Watson, LLP

(57) ABSTRACT

The design and synthesis of six nickel charge transfer (CT) complexes are described herein. The six nickel CT complexes have a nickel center, two organic ligands coordinated with the nickel center to form a dianionic square planar supramolecule and an organic counter-cation as represented by

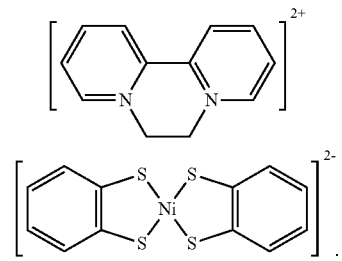

The ligands and counter-cations are selected to optimize properties, such as molecular alignment, film morphology, and molecular packaging. Described herein, the ligands can be 2,3-pyrazinedithiol (L1), 1,2-benzenedithol (L2) or 2,3-quinoxalinedithol (L3) and the counter-cations can be diquat (2,2'-ebpy) or methyl viologen (4,4'-mbpy). The six nickel CT complexes can also be utilized semiconductor devices, such as thin film transistors or inverters. Processes are also provided for the fabrication of semiconductors devices. The processes can include fabricating a substrate with a bilayer octadecylphosphonic acid (ODPA)/Al2O3 dielectric and applying one of the six nickel charge transfer (CT) complexes to the substrate.

4 Claims, 18 Drawing Sheets

(56) References Cited

OTHER PUBLICATIONS

Mj Baker-Hawkes et al. "Characterization and electronic structures of metal complexes containing benzene-1,2-dithiolate and related ligands." Journal of the American Chemical Society 1966, 88 (21), pp. 4870-4875.

Nishijo et al. "Structure and physical properties of molecule-based magnets including transition metal complexes of crown thioethers." Bulletin of the Chemical Society of Japan 2004, 77, 715.

Sandman et al. "Nickel, cobalt, and copper complexes of o-benzenediselenolate: synthesis and structural and magnetic properties." Inorganic Chemistry 1987, 26 (11), pp. 1664-1669.

Nishijo et al. "Weak-ferromagnetism in molecular magnets based on transition metal complexes of crown thioether." Polyhedron vol. 22, Issues 14-17, Jul. 15, 2003, pp. 1755-1758.

Ray et al. "Electronic Structure of Square Planar Bis(benzene-1,2-dithiolato)metal Complexes [M(L)2]z (z =2-, 1-, 0; M=0 Ni, Pd, Pt, Cu, Au): An Experimental, Density Functional, and Correlated ab Initio Study." Inorganic Chemistry 2005), 44, 5345.

Calas et al. "Formation of complexes by charge transfer between substituted tetrathiofulvalenes and bis (benzodithiolate-1,2) nickel." Tetrahedron Letters, vol. 16, Issue 50, 1975, pp. 4475-4478.

Noro et al. "Metal-organic thin-film Transistor (MOTFT) Based on a Bis(o-diiminobenzosemiquinonate) nickel(II) complex." Journal of the American Chemical Society 2005, 127, 10012.

Wada et al. "Organic semiconductors based on nickel complexes for thin—film transistors." Special Publication—Royal Society of Chemistry 2007, 306(Multifunctional Conducting Molecular Materials), 290.

Noro et al. "Ambipolar, singlecomponent, metal-organic thin-film transistors with high and balanced hole and electron mobilities."Advanced Materials 2008, 20, 3399.

Wada et al. "Air stability of n-channel organic transistors based on nickel coordination compounds." Organic Electronics 2007, 8, 759.

Cho et al. "High electron mobility in nickel bis(dithiolene) complexes." Journal of Materials Chemistry 2007, 17, 2642.

Mrkvova et al. "Synthesis, Properties and Crystal Structures of R[MIII(bdt)2] complexes (M = Ni, Co, Cu)." Transition Metal Chemistry, 2004, pp. 238-244, vol. 29, No. 3, Kluwer Academic Publishers, Netherlands.

Mahadevan et al. "Crystal and Molecular Structure of N-methylphenazinium bis(benzene-1,2-dithiolato)nickelate(III). Structure of (C13H11N2)[Ni(S2C6H4)2]." Journal of Crystallographic and Spectroscopic Research, 1985, pp. 305-316, vol. 15, No. 4.

NICKEL COMPLEXES FOR FLEXIBLE TRANSISTORS AND INVERTERS

TECHNICAL FIELD

This disclosure generally relates to the development and synthesis of nickel complexes and the use of the nickel complexes in flexible thin film transistors and inverters.

BACKGROUND

Semiconductor devices, such as flexible thin film transistors (TFTs) and inverters, have been widely used in a variety of modern applications. Examples of these applications include, but are not limited to, liquid crystal displays, electronic paper, and radio frequency identification tags. There is a growing demand to make these applications less expensive and more efficient. This demand drives the development and synthesis of new semiconducting materials that can facilitate production of inexpensive and highly efficient semiconductor devices.

Over the last thirty years, inorganic based charge-transfer (CT) compounds with interesting physical and spectroscopic properties have been investigated as potential new semiconducting materials. One example of inorganic based CT compounds with interesting physical and spectroscopic properties are nickel-based CT complexes. Molecular alignment, film morphology and molecular packing of the nickel CT complexes make them inexpensive and highly efficient semiconductor materials.

Nickel has eight valence electrons in the 3d-orbital and, therefore, can intrinsically coordinate with two neutral organic ligands and form a dianionic square planar supramolecule. Accordingly, the molecular alignment, film morphology and molecular packing depend on the selection of the organic ligands and counter cations for the nickel CT complexes. The selection of the organic ligands and the counter cations influences molecular interactions, thereby influencing the molecular arrangement, film morphology, and molecular packing of the resulting bulk semiconducting materials. By proper selection of the organic ligands and the counter cations, efficiency of the semiconducting material can be increased.

The foregoing description is merely intended to provide an overview of some of the conventional semiconductor devices and semiconducting materials, and is not intended to be exhaustive. Problems with the state of the art and corresponding benefits of some of the various non-limiting embodiments may become further apparent upon review of the following detailed description.

SUMMARY

The following presents a simplified summary of the various embodiments in order to provide a basic understanding of some aspects described herein. This summary is not an extensive overview of the disclosed subject matter. It is intended to neither identify key or critical elements of the disclosed subject matter nor delineate the scope of the subject embodiments. Its sole purpose is to present some concepts of the disclosed subject matter in a simplified form as a prelude to the more detailed description that is presented later.

Various embodiments are directed to the design of semiconducting materials. The semiconducting materials can be nickel charge transfer (CT) complexes. The nickel CT complexes can include a nickel center, two neutral organic ligands coordinated with the nickel center to form a dianionic square planar supramolecule, and a counter-cation. The ligands and counter-cations are selected to optimize properties, such as molecular alignment, film morphology, and molecular packaging. For example, the ligands and/or counter cation can be chosen so that the nickel CT complex is self-assembling. Described herein, the ligands can be 2,3-pyrazinedithiol ($L_1$), 1,2-benzenedithol ($L_2$) or 2,3-quinoxalinedithol ($L_3$) and the counter-cations can be diquat (2,2'-$^e$bpy) or methyl viologen (4,4'-$^m$bpy).

In another non-limiting embodiment, a process is provided for synthesizing the nickel CT complexes. The process can include dissolving a compound including a dianionic square planar complex of nickel and two organic neutral ligands with a nickel center and a compound including a counter-cation in a solvent. The process can also include precipitating the nickel CT complex including the dianionic square planar complex of nickel and two organic nickel ligands and the counter-cation. Described herein, the ligands can be 2,3-pyrazinedithiol ($L_1$), 1,2-benzenedithol ($L_2$) or 2,3-quinoxalinedithol ($L_3$) and the counter-cations can be diquat (2,2'-$^e$bpy) or methyl viologen (4,4'-$^m$bpy).

The nickel CT complexes can also be semiconductor devices, such as thin film transistors or inverters. The thin film transistors or invertors can be used in connection with radio frequency identification (RFID) tag systems. The RFID tag can be a low frequency RFID tag.

Processes are also provided for the fabrication of semiconductors devices. The processes can include fabricating a substrate with a bilayer octadecylphosphonic acid (ODPA)/$Al_2O_3$ dielectric. The bilayer can be formed at a low temperature, for example, at room temperature. The processes can further include applying one of the six nickel charge transfer (CT) complexes to the substrate, for example, by spin coating.

The following description and the annexed drawings set forth in detail certain illustrative aspects of the disclosed subject matter. These aspects are indicative, however, of but a few of the various ways in which the principles of the various embodiments may be employed. The disclosed subject matter is intended to include all such aspects and their equivalents. Other advantages and distinctive features of the disclosed subject matter will become apparent from the following detailed description of the various embodiments when considered in conjunction with the drawings.

DETAILED DESCRIPTION

Various aspects relate to the development of nickel charge transfer (CT) complexes for semiconductor device applications (e.g., flexible thin film transistors (TFTs) and inverters). A nickel CT complex includes a nickel center, two organic ligands, and a counter-cation. Selection of the organic ligands and the counter-cation can influence the material properties of the nickel CT complex and, therefore, the suitability of the nickel CT complex for high performance semiconductor device applications (e.g., applications requiring a high efficiency).

The nickel has eight valence electrons in the 3d-orbital, which allows the nickel to intrinsically coordinate with two neutral organic ligands. This coordination between the nickel center and the two neutral organic ligands can lead to dianionic square planar supramolecule. The ligand and counter-cation can influence properties of the nickel CT complex, including molecular alignment, film morphology and molecular packing.

Figure 1:
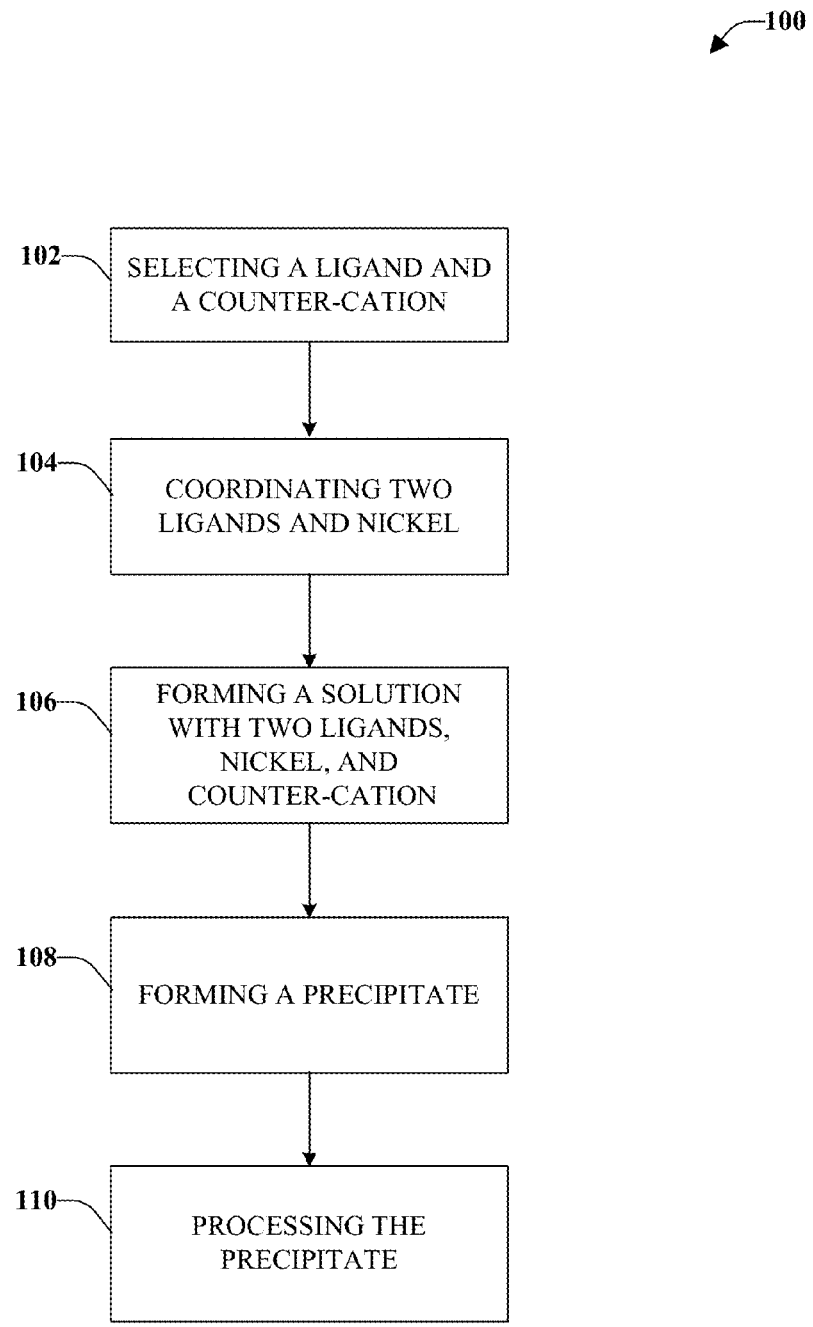
FIG. 1 is a schematic process flow diagram of a process for synthesizing a nickel charge transfer complex.

Referring now to FIG. 1, illustrated is a schematic process flow diagram showing a process 100 for synthesizing a nickel CT complex. At element 102, a ligand and a counter-cation can be chosen for the nickel CT complex. For example, the ligand can be a neutral organic ligand that can coordinate with the nickel. For another example, the counter cation can be an organic cation. The ligand and the CT complex can be chosen to optimize properties of the nickel CT complex, such as molecular alignment, film morphology, and molecular packaging, to create an efficient, inexpensive semiconductor device.

At element 104, the nickel and two ligands can coordinate to form a molecule with nickel as the center. The molecule can be a dianionic square planar supramolecule. At element 106, an ionic complex containing the nickel and two ligands and an ionic complex containing the counter-cation can be dissolved in a solvent. At element 108, the solution can be stirred (and, optionally, heated), allowing a precipitate to form. At element 110, the precipitate can be collected and processed (e.g., filtered, washed, and/or dried). The processed precipitate is the nickel CT complex.

Properties of the resulting nickel CT complex, such as molecular alignment, film morphology, and molecular packing, can be influenced by the selection of the ligand and a counter-cation. Described herein is the design and synthesis of six such square planar nickel CT complexes with different combinations of organic ligands and counter-cations and the application of these six nickel CT complexes in semiconductor devices and electronic applications. The organic ligands described herein are $L_1$, 2,3-pyrazinedithiol, $L_2$, 1,2-benzenedithol, and $L_3$, 2,3-quinoxalinedithol. The counter-cations described herein are [2,2'-$^e$bpy], diquat, and [4,4'-$^m$bpy], methyl viologen.

Selection of a different organic ligand and a different counter-cation for each of the six nickel CT complexes leads to differences in properties, such as molecular alignment, film morphology, and molecular packing of the bulk semiconducting material. Molecular alignment is a key issue for constructing a highly efficient semiconductor device. Film morphology and molecular packing are fundamental factors affecting carrier mobility of a given semiconductor. The ligands and counter-cations for the nickel CT complexes are selected so that the molecular alignment, film morphology, and molecular packing of the six nickel CT complexes can facilitate efficient semiconductor devices.

In one embodiment, the square planar nickel CT complex is [2,2'-$^e$bpy][Ni($L_1$)$_2$], where $L_1$ is the organic ligand 2,3-pyrazinedithiol and [2,2'-$^e$bpy] is the counter-cation diquat. The structure of [2,2'-$^e$bpy][Ni($L_1$)$_2$] is shown in formula (1).

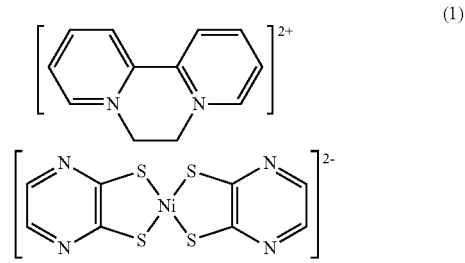

(1)

Figure 2:
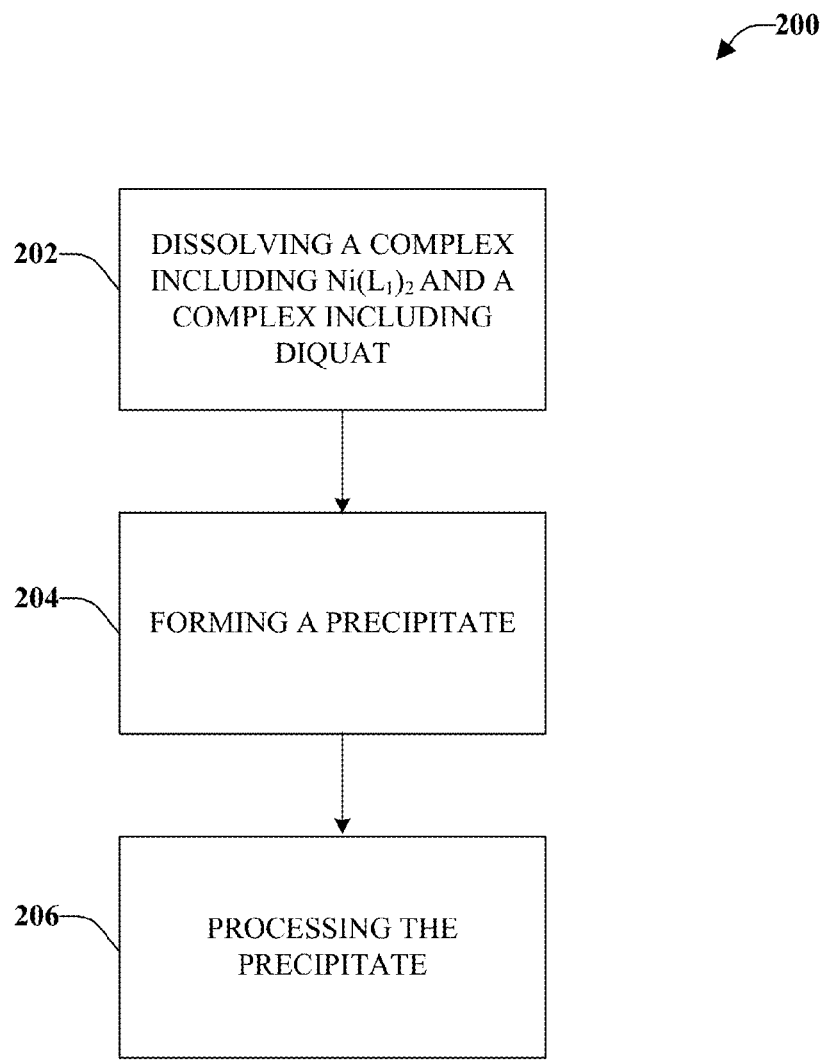
FIG. 2 is a schematic process flow diagram of a process for synthesizing a nickel charge transfer complex with a ligand 2,3-pyrazinedithiol ($L_1$) and a counter-cation diquat (2,2'-$^e$bpy).

Referring now to FIG. 2, illustrated therein is a schematic process flow diagram of a process 200 for synthesizing [2,2'-$^e$bpy][Ni($L_1$)$_2$]. At element 202, a complex including Ni($L_1$)$_2$ and a complex including 2,2'-$^e$bpy are dissolved in solvent (e.g., an organic solvent, such as an alcohol).

The complex including Ni($L_1$)$_2$ can be Na$_2$[Ni($L_1$)$_2$]. For example, the Na$_2$[Ni($L_1$)$_2$] can be formed through the following process. $L_1$ (2,3-pyrazinedithiol) and sodium metal can be dissolved in an organic solvent (e.g., methanol). For example, 3 g (20.8 mmol) of $L_1$ and 5 g (201.8 mmol) of sodium metal can be added to 200 ml of methanol. The mixture can be stirred at room temperature until all of the solids are dissolved, for example, under nitrogen for 1 hour. Nickel(II) chloride hexahydrate (e.g., obtained from Sigma-Aldrich) can be added to the mixture of $L_1$ and sodium metal. For example, 1.80 g (7.6 mmol) of nickel(II) chloride hexahydrate can be added in a dropwise manner to the mixture over a period of 30 minutes. The reaction mixture can be stirred at room temperature (e.g., under nitrogen for 3 hours). The resulting solution can have a reddish orange color. The solution can be filtered, and the collected filtrate evaporated. The solid collected can be washed with diethyl ether. This solid is $Na_2[Ni(L_1)_2]$. According to an experimental preparation, 2.0 g of $Na_2[Ni(L_1)_2]$ were synthesized (yield 68%). Through elemental analysis: analytically, the $Na_2[Ni(L_1)_2]$ was predicted to have C: 62.11, H: 8.69, and N: 9.05; after the synthesis, $Na_2[Ni(L_1)_2]$ was found to have C: 62.02, H: 8.72 and N: 9.11. Utilizing mass spectroscopy, using an ESI-MS, –ve mode, and $[M+Na]^-$ was found to be m/z 364.9.

The complex including 2,2'-$^e$bpy can be $[(2,2'-^ebpy)Br_2]$. The organic solvent in which the $Na_2[Ni(L_1)_2]$ and the $[(2,2'-^ebpy)Br_2]$ can be dissolved can be methanol. For example, 2.2 g (5.6 mmol) of $Na_2[Ni(L_1)_2]$ and 18.7 g (54.3 mmol) of $[(2,2'-^ebpy)Br_2]$ can be dissolved in 20 ml of methanol.

At element 204, the solution containing the dissolved $Ni(L_1)_2$ and 2,2'-$^e$bpy can be heated under stirring. For example, the solution can be heated at 60° C. for 1 hour under stirring. During the heating and stirring, a precipitate can form. For example, the precipitate can be a black precipitate. At element 206, the precipitate can be filtered, collected, and processed. The processing can include washing (e.g., with methanol) and drying the precipitate.

According to an experimental preparation, 2.1 g of $[2,2'-^ebpy][Ni(L_1)_2]$ were synthesized (yield 70%). Through elemental analysis: analytically, the $[2,2'-^ebpy][Ni(L_1)_2]$ was predicted to have C: 45.55, H: 3.06, and N: 15.94 and after the synthesis, $[2,2'-^ebpy][Ni(L_1)_2]$ was found to have C: 45.40, H: 3.10 and N: 15.90. Utilizing mass spectroscopy, the nickel CT compound was analyzed, using an ESI-MS, –ve mode, $[M]^{2-}$ was found to be m/z 171.0 and utilizing +ve mode, $2,2'-^ebpy]^{2+}$ was found to be m/z 92.1[.

In another embodiment, the square planar nickel CT complex is $[4,4'-^mbpy][Ni(L_1)_2]$, where $L_1$ is the organic ligand 2,3-pyrazinedithiol and $[4,4'-^mbpy]$ is the counter-cation methyl viologen. The structure of $[4,4'-^mbpy][Ni(L_1)_2]$ is shown in formula (2).

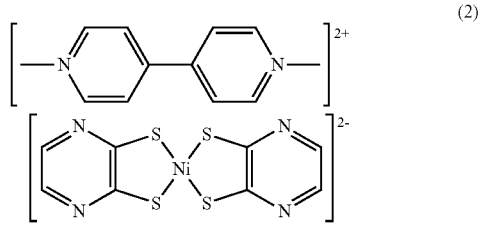

(2)

Figure 3:
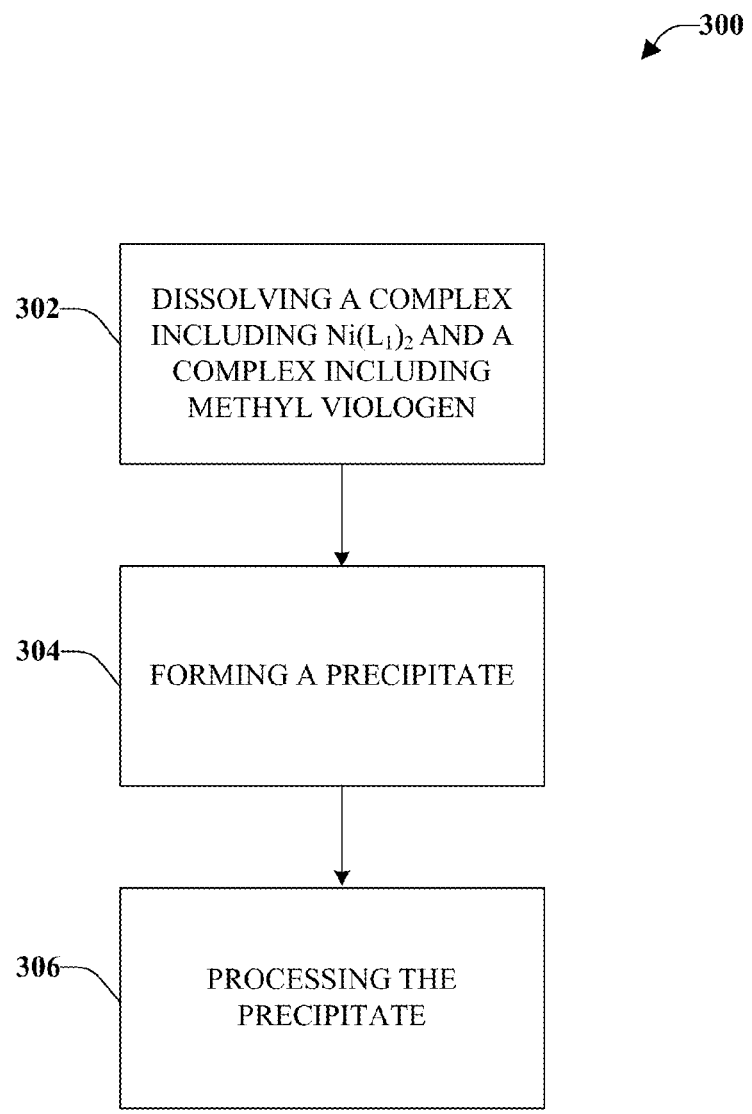
FIG. 3 is a schematic process flow diagram of a process for synthesizing a nickel charge transfer complex with a ligand 2,3-pyrazinedithiol ($L_1$) and a counter-cation methyl viologen (4,4'-$^m$bpy).

Referring now to FIG. 3, illustrated therein is a schematic process flow diagram of a process 300 for synthesizing $[4,4'-^mbpy][Ni(L_1)_2]$. At element 302, a complex including $Ni(L_1)_2$ and a complex including 4,4'-$^e$bpy are dissolved in solvent.

The complex including $Ni(L_1)_2$ can be $Na_2[Ni(L_1)_2]$. For example, the $Na_2[Ni(L_1)_2]$ can be formed through the following process. $L_1$ (2,3-pyrazinedithiol) and sodium metal can be dissolved in an organic solvent (e.g., methanol). For example, 3 g (20.8 mmol) of $L_1$ and 5 g (201.8 mmol) of sodium metal can be added to 200 ml of methanol. The mixture can be stirred at room temperature until all of the solids are dissolved, for example, under nitrogen for 1 hour. Nickel(II) chloride hexahydrate can be added to the mixture of $L_1$ and sodium metal. For example, 1.80 g (7.6 mmol) of nickel(II) chloride hexahydrate can be added in a dropwise manner to the mixture over a period of 30 minutes. The reaction mixture can be stirred at room temperature (e.g., under nitrogen for 3 hours). The resulting solution can have a reddish orange color. The solution can be filtered, and the collected filtrate evaporated. The solid collected can be washed with diethyl ether. This solid is $Na_2[Ni(L_1)_2]$. According to an experimental preparation, 2.0 g of $Na_2[Ni(L_1)_2]$ were synthesized (yield 68%). Through elemental analysis: analytically, the $Na_2[Ni(L_1)_2]$ was predicted to have C: 62.11, H: 8.69, and N: 9.05; after the synthesis, $Na_2[Ni(L_1)_2]$ was found to have C: 62.02, H: 8.72 and N: 9.11. Utilizing mass-spectroscopy, using an ESI-MS, –ve mode, and $[M+Na]^-$ was found to be m/z 364.9.

The complex including 4,4'-$^e$bpy can be $[(4,4'-^mbpy)I_2]$. The solvent in which the $Na_2[Ni(L_1)_2]$ and the $[(4,4'-^mbpy)I_2]$ can be dissolved can be a water (e.g., hot water) and MeOH solution. For example, 1.7 g (1.3 mmol) of $Na_2[Ni(L_1)_2]$ and 9.5 g (21.5 mmol) of $[(4,4'-^mbpy)I_2]$ can be dissolved in 140 ml of hot water/MeOH solution.

At element 304, the mixture containing the dissolved $Ni(L_1)_2$ and 4,4'-$^m$bpy can be heated under stirring. For example, the solution can be heated at 60° C. for 1 hour under stirring. During the heating and stirring, a precipitate can form. For example, the precipitate can be a black precipitate. At element 306, the precipitate can be filtered, collected, and processed. The processing can include washing (e.g., with methanol) and drying the precipitate. The precipitate is insoluble in most common solvents.

According to an experimental preparation, 2.2 g of $[4,4'-^mbpy][Ni(L_1)_2]$ were synthesized (yield 95%). Through elemental analysis: analytically, the $[4,4'-^mbpy][Ni(L_1)_2]$ was predicted to have C: 45.38, H: 3.43, and N: 15.88. After the synthesis, $[4,4'-^mbpy][Ni(L_1)_2]$ was found to have C: 45.12, H: 3.51 and N: 15.92. Utilizing mass-spectroscopy, the nickel CT complex was analysed using an ESI-MS, –ve mode, and $[M]^-$ was found to be m/z 338.1.

In yet another embodiment, the square planar nickel CT complex is $[2,2'-^ebpy][Ni(L_2)_2]$, where $L_2$ is the organic ligand 1,2-benzenedithol and $[2,2'-^ebpy]$ is the counter cation diquat. The structure of $[2,2'-^ebpy][Ni(L_2)_2]$ is shown in formula (3).

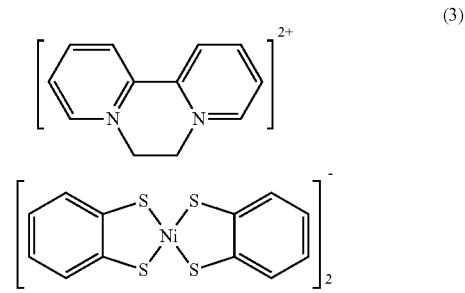

(3)

Figure 4:
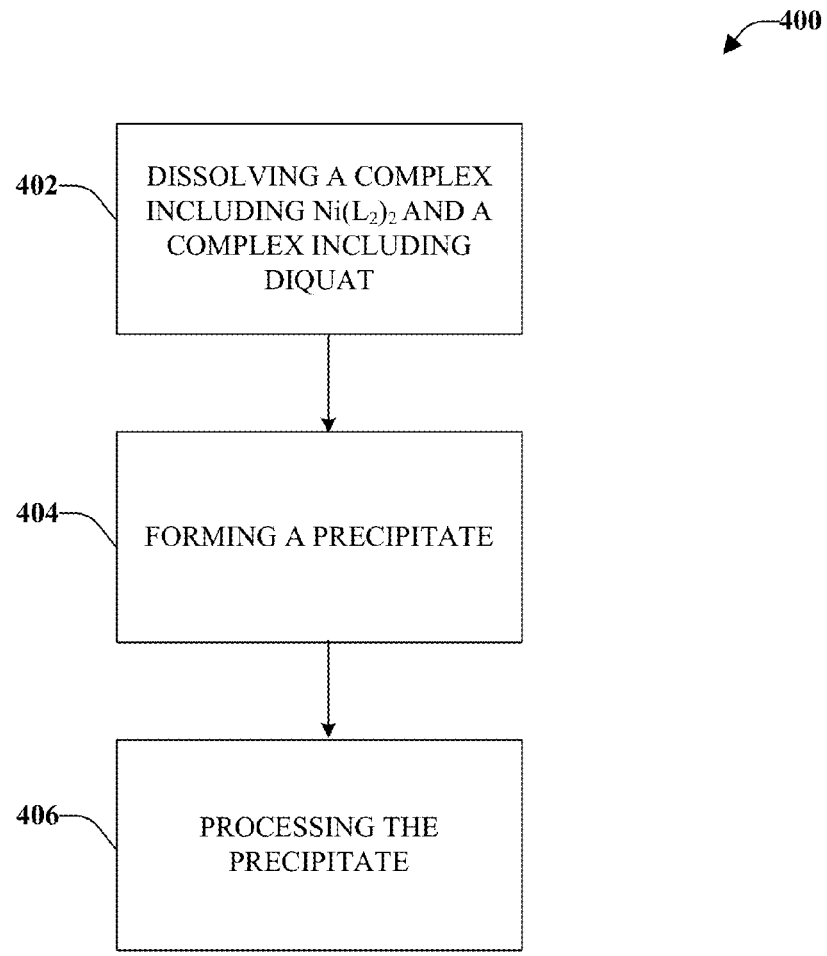
FIG. 4 is a schematic process flow diagram of a process for synthesizing a nickel charge transfer complex with a ligand 1,2-benzenedithol ($L_2$) and a counter-cation diquat (2,2'-$^e$bpy).

Referring now to FIG. 4, illustrated therein is a schematic process flow diagram of a process 400 for synthesizing $[2,2'-^ebpy][Ni(L_2)_2]$. At element 402, a complex including $Ni(L_2)_2$ and a complex including 2,2'-$^e$bpy are dissolved in solvent (e.g., an organic solvent, such as an alcohol).

The complex including Ni(L$_2$)$_2$ can be Na$_2$[Ni(L$_2$)$_2$]. For example, the Na$_2$[Ni(L$_2$)$_2$] can be formed through the following process. L$_2$(1,2-benzenedithol) and sodium metal can be dissolved in an organic solvent (e.g., methanol). For example, 2.5 g (17.6 mmol) of L$_2$ and 5 g (200 mmol) of sodium metal can be added to 200 ml of methanol. The mixture can be stirred at room temperature until all of the solids are dissolved, for example, under nitrogen for 1 hour. Nickel(II) chloride hexahydrate can be added to the mixture of L$_2$ and sodium metal. For example, 1.66 g (6.7 mmol) of nickel(II) chloride hexahydrate can be added in a dropwise manner to the mixture over a period of 30 minutes. The reaction mixture can be stirred at room temperature (e.g., under nitrogen for 3 hours). The resulting solution can have a reddish brown color. The solution can be filtered, and the collected filtrate evaporated. The solid collected can be washed with diethyl ether. This solid is Na$_2$[Ni(L$_2$)$_2$]. According to an experimental preparation, 3.4 g of Na$_2$[Ni(L$_2$)$_2$] were synthesized (yield 50%). Through elemental analysis: analytically, the Na$_2$[Ni(L$_2$)$_2$] was predicted to have C: 39.80 and H: 2.23; after the synthesis, Na$_2$[Ni(L$_2$)$_2$] was found to have C: 39.90 and H: 2.24. Utilizing mass-spectroscopy, using an ESI-MS, −ve mode, [M]$^−$ was found to be m/z 338.1.

The complex including 2,2'-$^e$bpy can be [(2,2'-$^e$bpy)Br$_2$]. The organic solvent in which the Na$_2$[Ni(L$_2$)$_2$] and the [(2,2'-$^e$bpy)Br$_2$] can be dissolved can be methanol. For example, 2.2 g (6.1 mmol) of Na$_2$[Ni(L$_2$)$_2$] and 10 g (29.1 mmol) of [(2,2'-$^e$bpy)Br$_2$] can be dissolved in 200 ml of methanol.

At element 404, the solution containing the dissolved Ni(L$_2$)$_2$ and 2,2'-$^e$bpy can be heated under stirring. For example, the solution can be heated at 60° C. for 1 hour under stirring. During the heating and stirring, a precipitate can form. For example, the precipitate can be a black precipitate. At element 406, the precipitate can be filtered, collected, and processed. The processing can include washing (e.g., with methanol) and drying the precipitate.

According to an experimental preparation, 1.3 g of [2,2'-$^e$bpy][Ni(L$_1$)$_2$] were synthesized (yield 24%). Through elemental analysis: analytically, the [2,2'-$^e$bpy][Ni(L$_2$)$_2$] was predicted to have C: 50.13, H: 3.27, and N: 3.25. After the synthesis, [2,2'-$^e$bpy][Ni(L$_1$)$_2$] was found to have C: 50.21, H: 3.25 and N: 3.20. Utilizing mass-spectroscopy the nickel CT compound was analyzed, using an ESI-MS, −ve mode, [M]$^−$ was found to be m/z 338.1 and utilizing +ve mode, [2,2'-$^e$bpy]$^{2+}$ was found to be m/z 92.1.

In a further embodiment, the square planar nickel CT complex is [4,4'-$^m$bpy][Ni(L$_2$)$_2$], where L$_2$ is the organic ligand 1,2-benzenedithol and [4,4'-$^e$bpy] is the counter-cation methyl viologen. The structure of [4,4'-$^m$bpy][Ni(L$_2$)$_2$] is shown in formula (4).

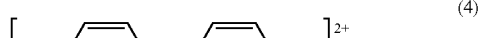

(4)

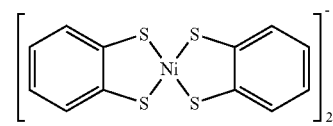

Figure 5:
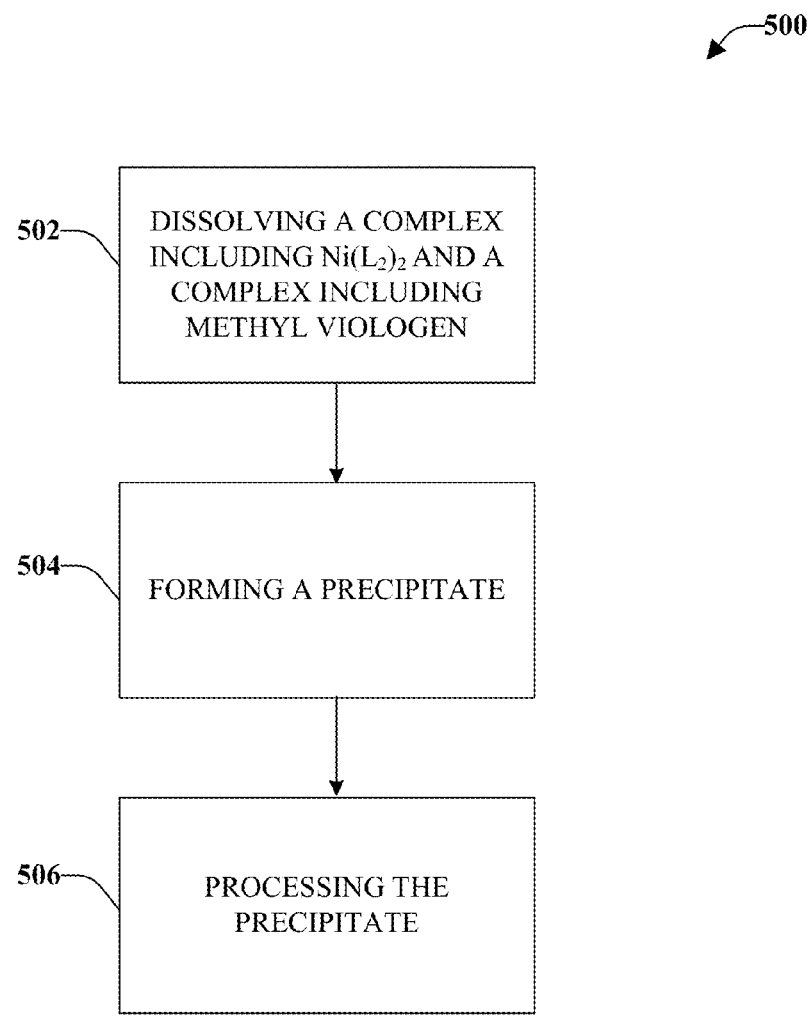
FIG. 5 is a schematic process flow diagram of a process for synthesizing a nickel charge transfer complex with a ligand 1,2-benzenedithol ($L_2$) and a counter-cation methyl viologen (4,4'-$^m$bpy).

Referring now to FIG. 5, illustrated therein is a schematic process flow diagram of a process 500 for synthesizing [4,4'-$^m$bpy][Ni(L$_2$)$_2$]. At element 502, a complex including Ni(L$_2$)$_2$ and a complex including 4,4'-$^e$bpy are dissolved in solvent.

The complex including Ni(L$_2$)$_2$ can be Na$_2$[Ni(L$_2$)$_2$]. For example, the Na$_2$[Ni(L$_2$)$_2$] can be formed through the following process. L$_2$ (1,2-benzenedithol) and sodium metal can be dissolved in an organic solvent (e.g., methanol). For example, 2.5 g (17.6 mmol) of L$_2$ and 5 g (200 mmol) of sodium metal can be added to 200 ml of methanol. The mixture can be stirred at room temperature until all of the solids are dissolved, for example, under nitrogen for 1 hour. Nickel(II) chloride hexahydrate can be added to the mixture of L$_2$ and sodium metal. For example, 1.66 g (6.7 mmol) of nickel(II) chloride hexahydrate can be added in a dropwise manner to the mixture over a period of 30 minutes. The reaction mixture can be stirred at room temperature (e.g., under nitrogen for 3 hours). The resulting solution can have a reddish brown color. The solution can be filtered, and the collected filtrate evaporated. The solid collected can be washed with diethyl ether. This solid is Na$_2$[Ni(L$_2$)$_2$]. According to an experimental preparation, 3.4 g of Na$_2$[Ni(L$_2$)$_2$] were synthesized (yield 50%). Through elemental analysis: analytically, the Na$_2$[Ni(L$_2$)$_2$] was predicted to have C: 39.80 and H: 2.23; after the synthesis, Na$_2$[Ni(L$_2$)$_2$] was found to have C: 39.90 and H: 2.24. Utilizing mass-spectroscopy, using an ESI-MS, −ve mode, [M]$^−$ was found to be m/z 338.1.

The complex including 4,4'-$^e$bpy can be [(4,4'-$^m$bpy)I$_2$]. The solvent in which the Na$_2$[Ni(L$_2$)$_2$] and the [(4,4'-$^m$bpy)I$_2$] can be dissolved can be a water (e.g., hot water) and MeOH solution. For example, 1.7 g (4.7 mmol) of Na$_2$[Ni(L$_2$)$_2$] and 10 g (22.7 mmol) of [(4,4'-$^m$bpy)I$_2$] can be dissolved in 14 ml of hot water/MeOH solution (2:5 v/v).

At element 504, the mixture containing the dissolved Ni(L$_2$)$_2$ and 4,4'-$^m$bpy can be heated under stirring. For example, the solution can be heated at 60° C. for 1 hour under stirring. During the heating and stirring, a precipitate can form. For example, the precipitate can be a black precipitate. At element 506, the precipitate can be filtered, collected, and processed. The processing can include washing (e.g., with a hot water/methanol mixture) and drying the precipitate.

According to an experimental preparation, 2.9 g of [4,4'-$^m$bpy][Ni(L$_2$)$_2$] were synthesized (yield 75%). Through elemental analysis: analytically, the [4,4'-$^m$bpy][Ni(L$_2$)$_2$] was predicted to have C: 50.01, H: 3.50, and N: 3.24 and after the synthesis, [4,4'-$^m$bpy][Ni(L$_{1\backslash2}$)$_2$] was found to have C: 50.08, H: 3.45 and N: 3.19. Utilizing mass-spectroscopy, the nickel CT complex was analysed using an ESI-MS, −ve mode, [M]$^−$ was found to be m/z 338.1 and utilizing +ve mode, [4,4'-$^m$bpy]$^{2+}$ was found to be m/z 93.2.

In yet a further embodiment, the square planar nickel CT complex is [2,2'-$^e$bpy][Ni(L$_3$)$_2$], where L$_3$ is the organic ligand 2,3-quinoxalinedithol and [2,2'-$^e$bpy] is the counter-cation diquat. The structure of [2,2'-$^e$bpy][Ni(L$_3$)$_2$] is shown in formula (5).

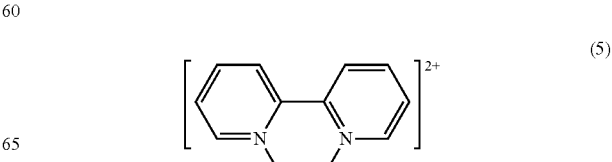

(5)

-continued

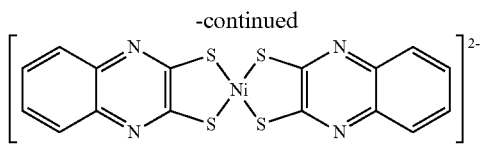

Figure 6:
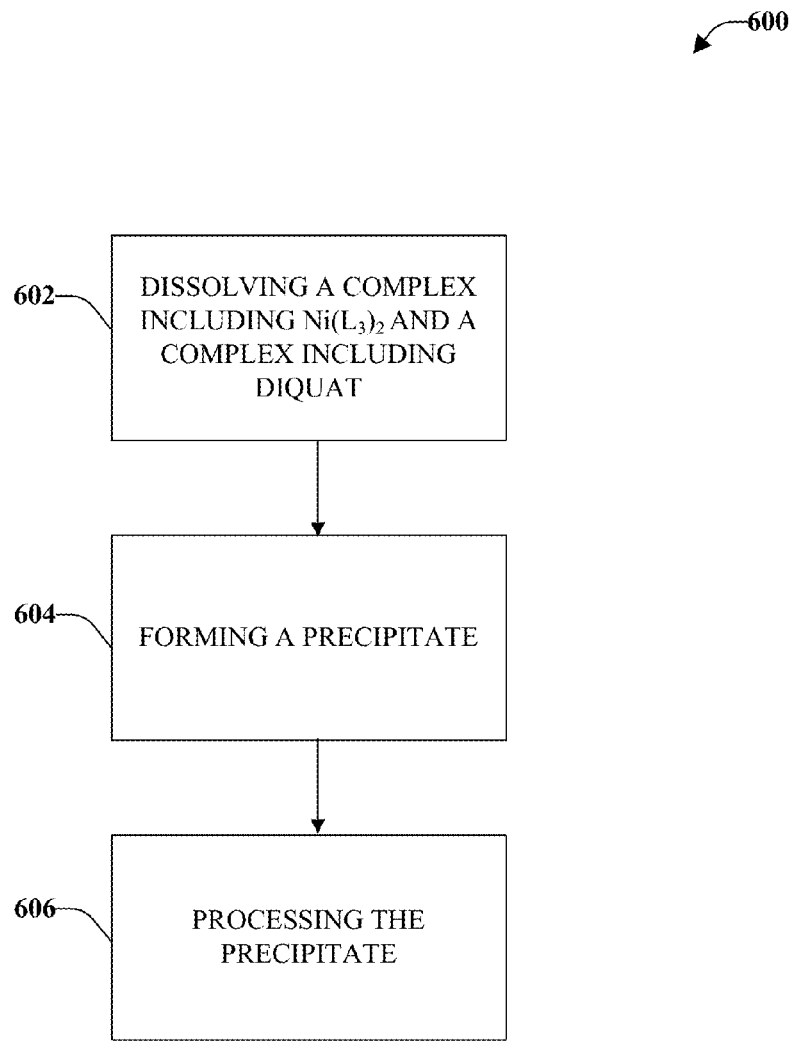
FIG. 6 is a schematic process flow diagram of a process for synthesizing a nickel charge transfer complex with a ligand 2,3-quinoxalinedithol ($L_3$) and a counter-cation diquat (2,2'-$^e$bpy).

Referring now to FIG. 6, illustrated therein is a schematic process flow diagram of a process 600 for synthesizing [2,2'-$^e$bpy][Ni(L$_3$)$_2$]. At element 602, a complex including Ni(L$_3$)$_2$ and a complex including 2,2'-$^e$bpy are dissolved in solvent (e.g., an organic solvent, such as an alcohol).

The complex including Ni(L$_3$)$_2$ can be Na$_2$[Ni(L$_3$)$_2$]. For example, the Na$_2$[Ni(L$_3$)$_2$] can be formed through the following process. L$_3$ (2,3-quinoxalinedithol) and sodium metal can be dissolved in an organic solvent (e.g., methanol). For example, 2.5 g (12.9 mmol) of L$_3$ and 3 g (130 mmol) of sodium metal can be added to 200 ml of methanol. The mixture can be stirred at room temperature until all of the solids are dissolved, for example, under nitrogen for 1 hour. Nickel(II) chloride hexahydrate dissolved in a 300 ml methanol can be added to the mixture of L$_3$ and sodium metal. For example, 1.03 g (4.3 mmol) of nickel(II) chloride hexahydrate can be added in a dropwise manner to the mixture over a period of 30 minutes. The reaction mixture can be stirred at room temperature (e.g., under nitrogen for 3 hours). The resulting solution can have a dark red, clear color. The solution can be filtered, and the collected filtrate evaporated. The solid collected can be washed with diethyl ether. This solid is Na$_2$[Ni(L$_3$)$_2$]. According to an experimental preparation, 3.2 g of Na$_2$[Ni(L$_3$)$_2$] were synthesized (yield 50%). Through elemental analysis: analytically, the Na$_2$[Ni(L$_3$)$_2$] was predicted to have C: 39.28, H: 1.65 and N: 11.45; after the synthesis, Na$_2$[Ni(L$_3$)$_2$] was found to have C: 39.12, H: 1.71, and N 11.39. Through proton nuclear magnetic resonance ($^1$H NMR) (d-DMSO$_3$): 7.43 (m, 4H), 7.19 (m, 4H). Utilizing mass-spectroscopy, using an ESI-MS, −ve mode, [M+Na]$^−$ was found to be m/z 465.1.

The complex including 2,2'-$^e$bpy can be [(2,2'-$^e$bpy)Br$_2$]. The organic solvent in which the Na$_2$[Ni(L$_3$)$_2$] and the [(2,2'-$^e$bpy)Br$_2$] can be dissolved can be methanol. For example, 1.3 g (2.7 mmol) of Na$_2$[Ni(L$_3$)$_2$] and 10 g (29.1 mmol) of [(2,2'-$^e$bpy)Br$_2$] can be dissolved in 200 ml of methanol.

At element 604, the solution containing the dissolved Ni(L$_3$)$_2$ and 2,2'-$^e$bpy can be heated under stirring. For example, the solution can be heated at 60° C. for 4 hour under stirring. During the heating and stirring, a precipitate can form. At element 606, the precipitate can be filtered, collected, and processed. The processing can include washing (e.g., with methanol) and drying the precipitate.

According to an experimental preparation, 2.4 g of [2,2'-$^e$bpy][Ni(L$_3$)$_2$] were synthesized (yield 65%). Through elemental analysis: analytically, the [2,2'-$^e$bpy][Ni(L$_3$)$_2$] was predicted to have C: 53.60, H: 3.21, and N: 13.39 and after the synthesis, [2,2'-$^e$bpy][Ni(L$_3$)$_2$] was found to have C: 53.84, H: 3.22 and N: 13.29. Through proton nuclear magnetic resonance ($^1$H NMR) (d-DMSO$_3$): 9.27 (d, 2H, J=6.8 Hz), 9.06 (d, 2H, J=8.0 Hz), 8.82 (t, 2H, J=8.0 Hz), 8.31 (t, 2H, J=6.8 Hz), 7.41 (m, 4H), 7.19 (m, 4H), 5.30 (s, 4H). Utilizing mass-spectroscopy, the nickel CT complex was analyzed using an ESI-MS, −ve mode, and [M+H]$^−$ was found to be m/z 443.0 and utilizing +ve mode [2,2'-$^e$bpy]$^{2+}$ was found to be m/z 92.1.

In another embodiment, the square planar nickel CT complex is [4,4'-$^m$bpy][Ni(L$_3$)$_2$], where L$_3$ is the organic ligand 2,3-quinoxalinedithol and [4,4'-$^m$bpy] is the counter-cation methyl viologen. The structure of [4,4'-$^m$bpy][Ni(L$_3$)$_2$] is shown in formula (6).

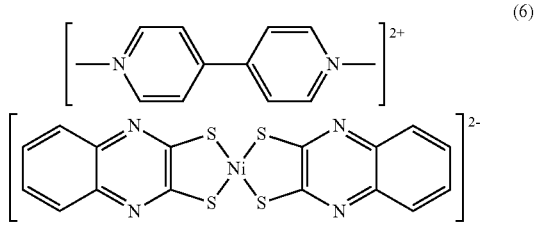

(6)

Figure 7:
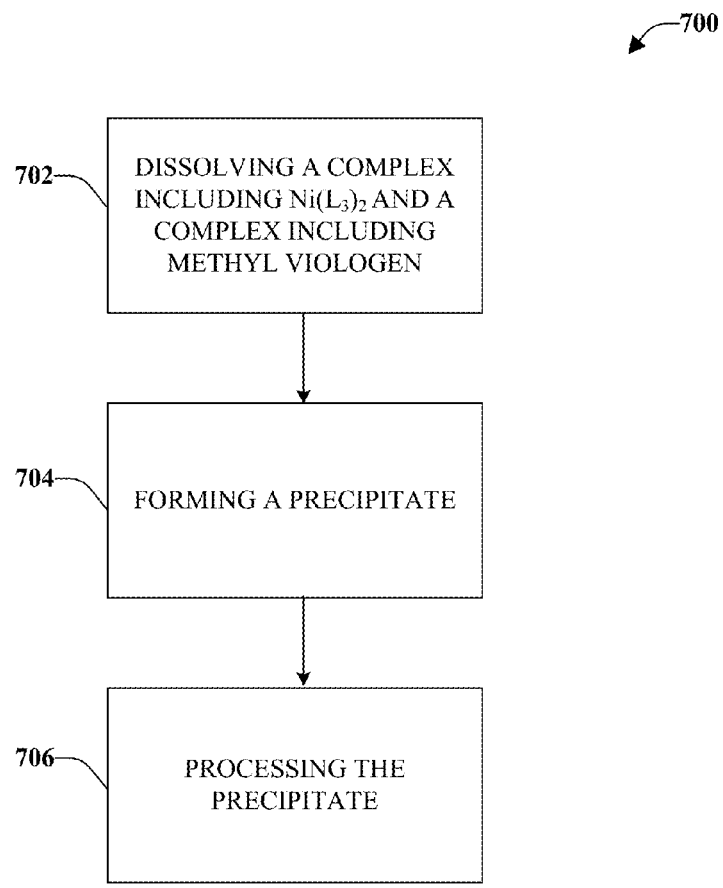
FIG. 7 is a schematic process flow diagram of a process for synthesizing a nickel charge transfer complex with a ligand 2,3-quinoxalinedithol ($L_3$) and a counter-cation methyl viologen (4,4'-$^m$bpy).
Figure 8:
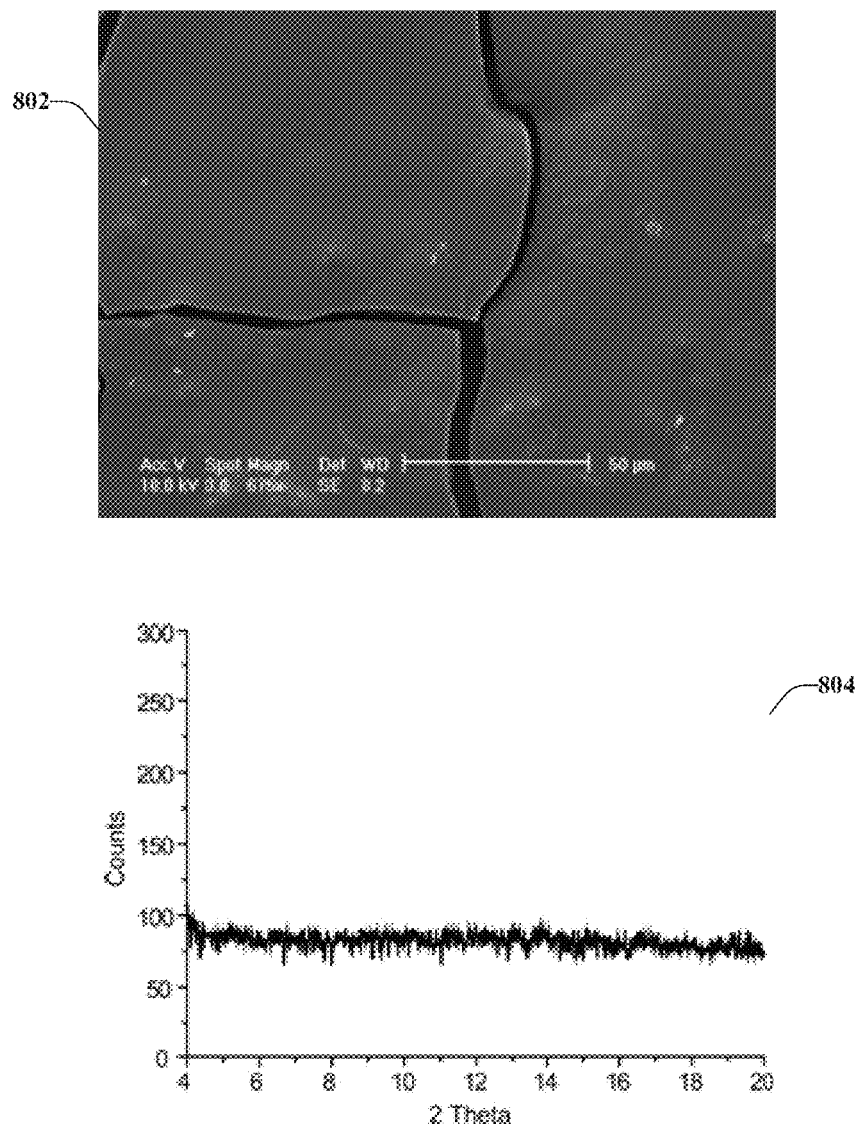
FIG. 8 shows a scanning electron microscopy (SEM) images and grazing incidence X-ray powered diffraction (GIXRD) spectrum of a nickel CT complex.

Referring now to FIG. 7, illustrated therein is a schematic process flow diagram of a process 700 for synthesizing [4,4'-$^m$bpy][Ni(L$_3$)$_2$]. At element 702, a complex including Ni(L$_3$)$_2$ and a complex including 4,4'-$^e$bpy are dissolved in solvent.

The complex including Ni(L$_3$)$_2$ can be Na$_2$[Ni(L$_3$)$_2$]. For example, the Na$_2$[Ni(L$_3$)$_2$] can be formed through the following process. L$_3$ (2,3-quinoxalinedithol) and sodium metal can be dissolved in an organic solvent (e.g., methanol). For example, 2.5 g (12.9 mmol) of L$_3$ and 3 g (130 mmol) of sodium metal can be added to 200 ml of methanol. The mixture can be stirred at room temperature until all of the solids are dissolved, for example, under nitrogen for 1 hour. Nickel(II) chloride hexahydrate dissolved in a 300 ml methanol can be added to the mixture of L$_3$ and sodium metal. For example, 1.03 g (4.3 mmol) of nickel(II) chloride hexahydrate can be added in a dropwise manner to the mixture over a period of 30 minutes. The reaction mixture can be stirred at room temperature (e.g., under nitrogen for 3 hours). The resulting solution can have a dark red, clear color. The solution can be filtered, and the collected filtrate evaporated. The solid collected can be washed with diethyl ether. This solid is Na$_2$[Ni(L$_3$)$_2$]. According to an experimental preparation, 3.2 g of Na$_2$[Ni(L$_3$)$_2$] were synthesized (yield 50%). According to an experimental preparation, 3.2 g of Na$_2$[Ni(L$_3$)$_2$] were synthesized (yield 50%). Through elemental analysis: analytically, the Na$_2$[Ni(L$_3$)$_2$] was predicted to have C: 39.28, H: 1.65 and N: 11.45; after the synthesis, Na$_2$[Ni(L$_3$)$_2$] was found to have C: 39.12, H: 1.71, and N 11.39. Through proton nuclear magnetic resonance ($^1$H NMR) (d-DMSO$_3$): 7.43 (m, 4H), 7.19 (m, 4H). Utilizing mass-spectroscopy, using an ESI-MS, −ve mode, was found to be [M+Na]$^−$ m/z 465.1.

The complex including 4,4'-$^e$bpy can be [(4,4'-$^m$bpy)I$_2$]. The solvent in which the Na$_2$[Ni(L$_2$)$_2$] and the [(4,4'-$^m$bpy)I$_2$] can be dissolved can be a methanol solution. For example, 1.3 g (2.7 mmol) of Na$_2$[Ni(L$_3$)$_2$] and 10 g (22.7 mmol) of [(4, 4'-$^m$bpy)I$_2$] can be dissolved in 200 ml of methanol.

At element 704, the mixture containing the dissolved Ni(L$_3$)$_2$ and 4,4'-$^m$bpy can be heated under stirring. For example, the solution can be heated at 60° C. for 4 hours under stirring. During the heating and stirring, a precipitate can form. At element 706, the precipitate can be filtered, collected, and processed. The processing can include washing (e.g., with methanol) and drying the precipitate.

According to an experimental preparation, 2.1 g of [4,4'-$^m$bpy][Ni(L$_3$)$_2$] were synthesized (yield 75%). Through elemental analysis: analytically, the [4,4'-$^m$bpy][Ni(L$_3$)$_2$] was predicted to have C: 53.43, H: 3.52, and N: 13.35. and after the synthesis, [4,4'-$^m$bpy][Ni(L$_{1\backslash3}$)$_2$] was found to have C: 53.21, H: 3.57 and N: 13.41. Through proton nuclear magnetic resonance ($^1$H NMR) (d-DMSO): 9.19 (d, 4H, J=6.8 Hz), 8.66 (d, 4H, J=6.8 Hz), 7.43 (m, 4H), 7.21 (m, 4H), 4.38

(s, 4H). Utilizing mass-spectroscopy, the nickel CT complex was analysed using an ESI-MS, −ve mode, [M]$^{2-}$ was found to be m/z 220.5 and utilizing +ve mode, [4,4'-$^m$bpy]$^{2+}$ was found to be m/z 93.2.

The six nickel CT complexes, 2,2'-$^e$bpy][Ni(L$_1$)$_2$], [4,4'-$^m$bpy][Ni(L$_1$)$_2$], [2,2'-$^e$bpy][Ni(L$_2$)$_2$], [4,4'-$^m$bpy][Ni(L$_2$)$_2$], [2,2'-$^e$bpy][Ni(Li$_3$)$_2$] and [4,4'-$^m$bpy][Ni(L$_3$)$_2$], have favorable properties to traditional nickel CT complexes. For example, the six nickel CT complexes are more thermally stable than traditional nickel CT complexes.

Thermal stabilities for the six nickel CT complexes, [2,2'-$^e$bpy][Ni(L$_1$)$_2$], [4,4'-$^m$bpy][Ni(L$_1$)$_2$], [2,2'-$^e$bpy][Ni(L$_2$)$_2$], [4,4'-$^m$bpy][Ni(L$_2$)$_2$], [2,2'-$^e$bpy][Ni(Li$_3$)$_2$] and [4,4'-$^m$bpy][Ni(L$_3$)$_2$], can be exhibited, for example, according to decomposition temperatures. As shown in TABLE 1, the decomposition temperatures for the six nickel CT complexes, [2,2'-$^e$bpy][Ni(L$_1$)$_2$], [4,4'-$^m$bpy][Ni(L$_1$)$_2$], [2,2'-$^e$bpy][Ni(L$_2$)$_2$], [4,4'-$^m$bpy][Ni(L$_2$)$_2$], [2,2'-$^e$bpy][Ni(Li$_3$)$_2$] and [4,4'-$^m$bpy][Ni(L$_3$)$_2$], were tested against the decomposition temperatures of traditional nickel CT complexes, Na$_2$[Ni(L$_1$)$_2$], Na$_2$[Ni(L$_2$)$_2$], and Na$_2$[Ni(L$_3$)$_2$]. Each of the six nickel CT complexes, [2,2'-$^e$bpy][Ni(L$_1$)$_2$], [4,4'-$^m$bpy][Ni(L$_1$)$_2$], [2,2'-$^e$bpy][Ni(L$_2$)$_2$], [4,4'-$^m$bpy][Ni(L$_2$)$_2$], [2,2-$^e$bpy][Ni(Li$_3$)$_2$] and [4,4'-$^m$bpy][Ni(L$_3$)$_2$], exhibited a higher decomposition temperature than traditional nickel CT complexes Na$_2$[Ni(L$_1$)$_2$], Na$_2$[Ni(L$_2$)$_2$], and Na$_2$[Ni(L$_3$)$_2$]. The three nickel CT complexes with the counter-cation methyl viologen, [4,4'$^{-m}$bpy][Ni(L$_1$)$_2$], [4,4'$^{-m}$bpy][Ni(L$_2$)$_2$], and [4,4'$^{-m}$bpy][Ni(L$_3$)$_2$] are more thermally stable than both traditional nickel CT complexes, Na$_2$[Ni(L$_1$)$_2$], Na$_2$[Ni(L$_2$)$_2$], and Na$_2$[Ni(L$_3$)$_2$], and nickel CT complexes with the counter-cation diquat, [2,2'-$^e$bpy][Ni(L$_1$)$_2$], [2,2'-$^e$bpy][Ni(L$_2$)$_2$], and [2,2'-$^e$bpy][Ni(L$_3$)$_2$].

TABLE 1

Decomposition temperature of the six nickel CT complexes.

| | T$_{decomp}$/° C.[a] |
|---|---|
| Na$_2$[Ni(L$_1$)$_2$] | 200 |
| [2,2'-$^e$bpy][Ni(L$_1$)$_2$] | 275 |
| [4,4'-$^m$bpy][Ni(L$_1$)$_2$] | 290 |
| Na$_2$[Ni(L$_2$)$_2$] | 200 |
| [2,2'-$^e$bpy][Ni(L$_2$)$_2$] | 250 |
| [4,4'-$^m$bpy][Ni(L$_2$)$_2$] | 250 |
| Na$_2$[Ni(L$_3$)$_2$] | 210 |
| [2,2'-$^e$bpy][Ni(L$_3$)$_2$] | 210 |
| [4,4'-$^m$bpy][Ni(L$_3$)$_2$] | 300 |

[a]Temperature of 10% weight loss utilizing a thermogravimetry analyzer (TA Instruments) Q5- from 30 to 100° C. at a heating rate of 10° C./min under N$_2$ atmosphere.

Further for example, the six nickel CT complexes exhibit favorable properties including molecular alignment, film morphology and molecular packaging. Molecular alignment is a key issue for constructing highly efficient organic semiconductor devices. Film morphology and molecular packaging are fundamental factors affecting carrier mobility of a given semiconductor.

Referring now to FIGS. 8, and 14-18, illustrated are scanning electron microscopy (SEM) images and grazing incidence X-ray powered diffractions (GIXRD) spectra of thin films of the six nickel CT complexes. Surface image of thin films of the six nickel CT complexes were recorded by Philips XL30 FEG SEM. GIXRD were recorded using a Bruker D8 Advance diffractometer with a CuKα X-ray radiation (λ=1.54146 Å, rated at 1.6 kW) with scan range=1.5-30° (2θ), step size=0.05°, scan speed=1 s per step.

The three nickel CT complexes with counter-cation diquat, [2,2'-$^e$bpy][Ni(L$_1$)$_2$] (SEM 802, GIXRD 804), [2,2'-$^e$bpy][Ni(L$_2$)$_2$] (SEM 806, GIXRD 808), [2,2'-$^e$bpy][Ni(L$_3$)$_2$] (SEM 810, GIXRD 812), exhibit a smooth film morphology with an amorphous nature. The three nickel CT complexes with the counter-cation methyl viologen, [4,4'-$^m$bpy][Ni(L$_1$)$_2$] (SEM 814, GIXRD 816), [4,4'-$^m$bpy][Ni(L$_2$)$_2$] (SEM 818, GIXRD 820), [4,4'-$^m$bpy][Ni(L$_3$)$_2$] (SEM 822, GIXRD 824), exhibit regular rod morphology with crystallized properties.

Figure 9:
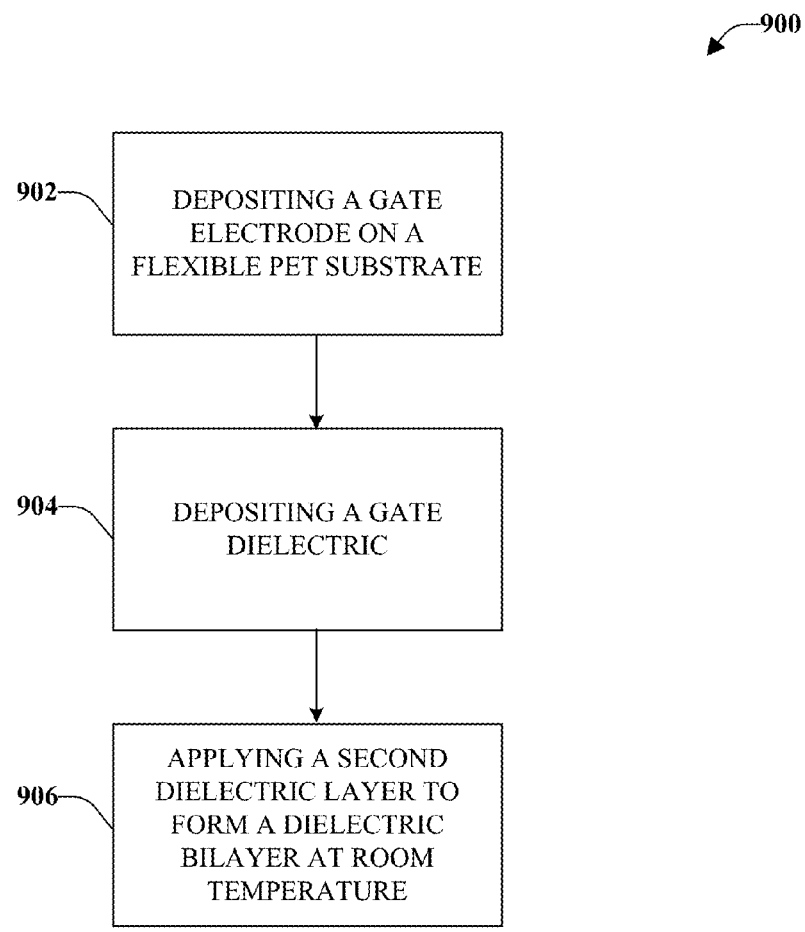
FIG. 9 is a schematic process flow diagram of a process for fabricating a substrate fir a semiconductor device.

Referring now to FIG. 9, illustrated is a schematic process flow diagram of a process 900 for fabricating a substrate for a semiconductor device (e.g., a thin film transistor or inverter). At element 902, a gate electrode can be deposited onto a substrate. For example, the gate electrode can be an Ag gate electrode. The Ag gate electrode can be a 50-nm thick Ag film. The substrate can be a poly(ethylene terephthalate) (PET) substrate (e.g., a flexible PET substrate). The gate electrode can be deposited onto the substrate, for example, through a shadow mask by thermal evaporation.

At element 904, a gate dielectric can be deposited on the gate electrode and substrate. For example, the gate dielectric can be an Al$_2$O$_2$ layer. The Al$_2$O$_2$ layer can be a patterned 26-nm thick Al$_2$O$_2$ layer. The gate dielectric can be deposited on the substrate (e.g., Ag/PET substrate) by, for example, a Savannah 100 ALD system at a substrate temperature of 80° C. and 1.8×10$^{-1}$ Torr.

At element 906, an octadecylphosphonic acid (ODPA) self-assembled monolayer (SAM) can be applied to the substrate after fabricating the gate dielectric. The ODPA SAM can be prepared, for example, by immersing the substrate in a 2-propanol solution containing 5 mM of ODPA. Keeping the solution at room temperature, the substrates can remain in the solution for a time period. For example, the time period can be 17 hours. After the period in solution, the substrates can be rinsed (e.g., by pure 2-propanol), blown dry (e.g., with nitrogen), and briefly baked (e.g., on a hotplate at 60° C. for 30 minutes). Accordingly, the bilayer ODPA/Al$_2$O$_3$ can be processed at a low temperature on PET substrates.

Figure 10:
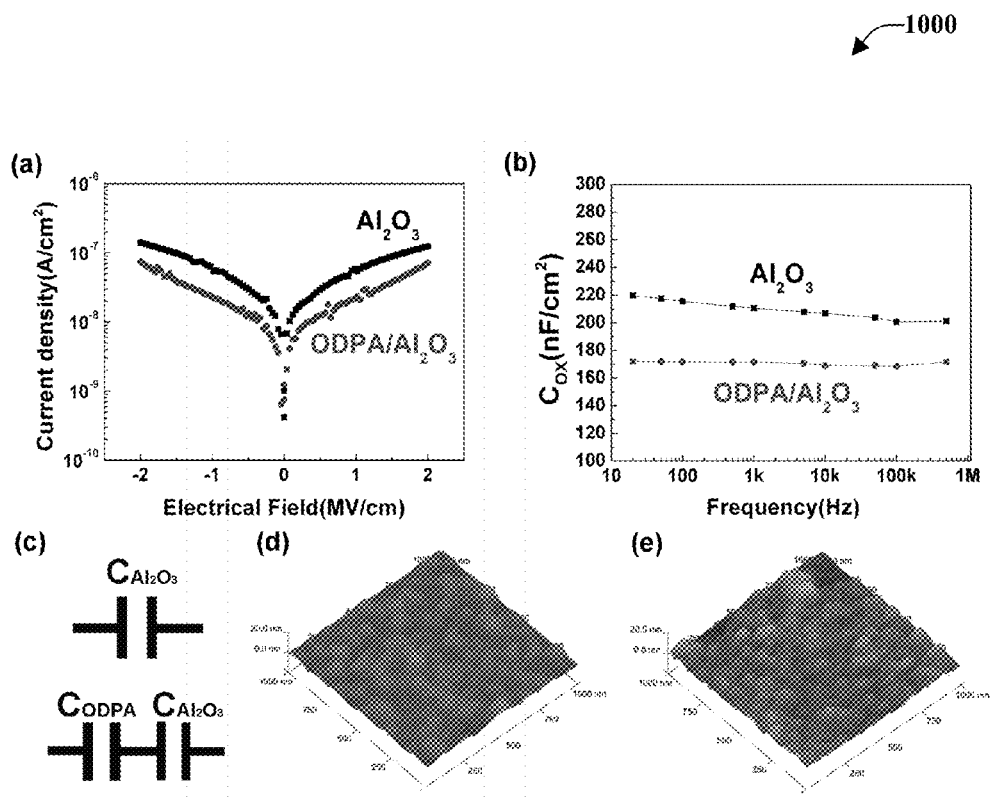
FIG. 10 shows the suitability of thin films produced using the process shown in FIG. 9 for fabricating semiconductor devices.

Process 900 produces films substrates suitable for fabricating a semiconductor device, such as a low voltage thin film transistor. For example, the thin films can exhibit a stable capacitance between 20 Hz and 600 kHz. Performance and mechanical properties of ODPA/Al$_2$O$_3$ were found to be superior to both Al$_2$O$_3$ alone, as well as SiO$_2$. FIG. 10 illustrates the suitability of the films produced using process 900 for fabricating a semiconductor device. Element (a) is a plot of current density versus electric field characteristics for Al$_2$O$_3$ and ODPA/Al$_2$O$_3$. For the ODPA/Al$_2$O$_3$, the leakage current density was fond to be 7×10$^{-3}$ A/cm$^2$ at an applied electrical field of 2 MV/cm. Element (b) is a plot of capacitance density (C$_{ox}$) versus frequency characteristics for Al$_2$O$_3$ and ODPA/Al$_2$O$_3$. The capacitance density for ODPA/Al$_2$O$_3$ was shown to be ~172 nF/cm$^2$. Element (c) is a capacitor model for Al$_2$O$_3$ and bilayer ODPA/Al$_2$O$_3$. Element (d) is a 3D tapping mode atomic force microscopy (AFM) height image of Al$_2$O$_3$. Element (e) is a 3D tapping mode AFM height image of a bilayer ODPA/Al$_2$O$_3$.

The bilayer ODPA/Al$_2$O$_3$ can be formed at a low temperature on the flexible substrate for device fabrication. In semiconductor devices, this bilayer dielectric can help to enhance the mobility of the six nickel CT complexes in semiconductor device applications. This can lead to an improved performance of the semiconductor devices (e.g., high performance, flexible, and/or operational at low voltages (~3V)).

Figure 11:
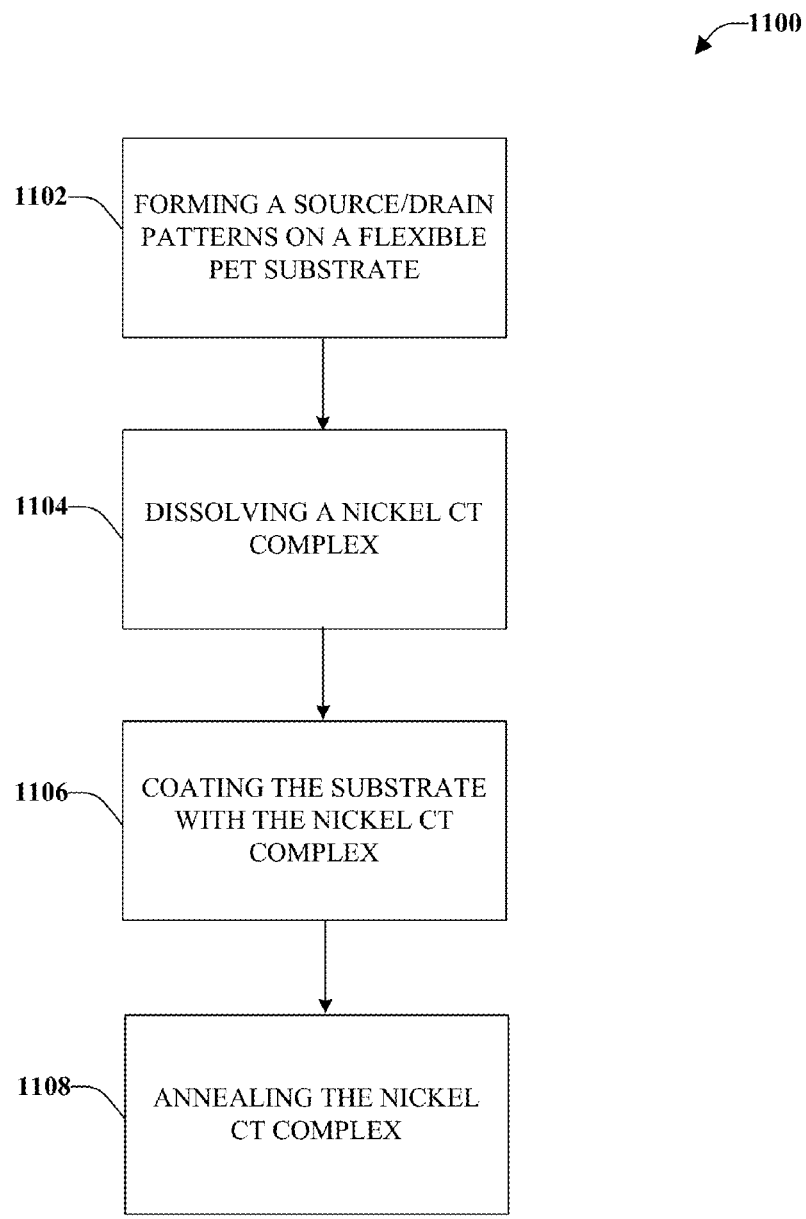
FIG. 11 is a schematic process flow diagram of a method for fabricating a semiconductor device with a nickel CT complex.
Figure 12:
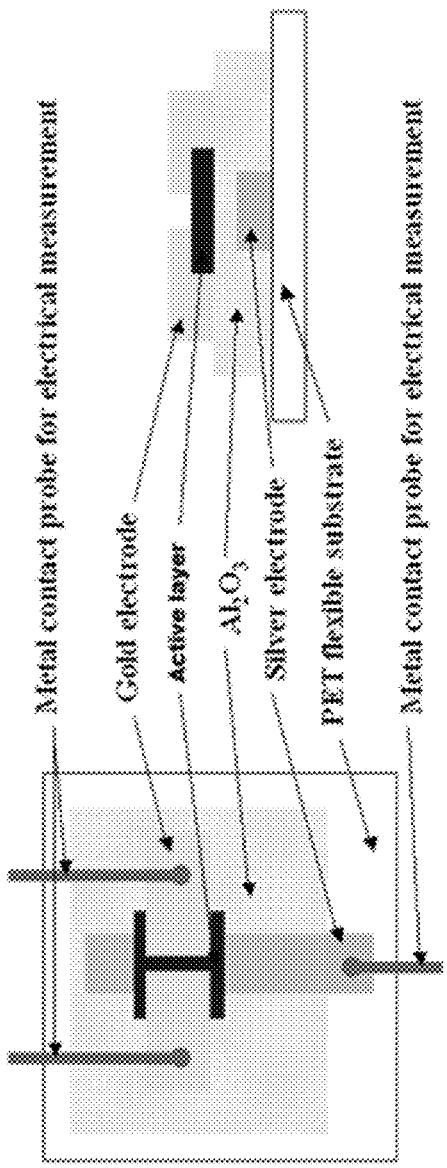
FIG. 12 is a schematic illustration of an as-fabricated patterned substrate.

Referring now to FIG. 11, illustrated is a schematic process flow diagram of a process 1100 for fabricating a semiconductor device utilizing one of the six nickel CT complexes. At element 1102, source/drain contact patterns can be formed on a flexible PET substrate. The source/drain patterns can be, for example, Au source/drain contact patterns. The source/drain patterns can be formed via shadow mask. The substrate can be, for example, an flexible ODPA/Al₂O₃/PET substrate as described with respect to FIGS. 9 and 10. An example of a patterned substrate fabricated according to element 1102 is shown in FIG. 12.

Referring back to FIG. 11, at element 1104, a nickel CT complex can be dissolved. For example, the nickel CT complex can be [2,2'-$^e$bpy][Ni(L₁)₂], [4,4'-$^m$bpy][Ni(L₁)₂], [2,2'-$^e$bpy][Ni(L₂)₂], [4,4'-$^m$bpy][Ni(L₂)₂], [2,2'-$^e$bpy][Ni(Li₃)₂] and [4,4'-$^m$bpy][Ni(L₃)₂]. The nickel CT complex can be dissolved in dimethylformamide (DMF). For example, the nickel CT complex can be dissolved in the DFM by ultrasonic bath.

At element 1106, the resulting solution can be spin coated on the patterned substrates (e.g., patterned ODPA/Al₂O₃/PET substrates). The solution can be spin coated with a spin speed of 2000 rmp/min. At element 1108, the coated pattern substrate can be annealed. For example, the coated patterned substrate can be annealed at 100° C. under N₂ atmosphere for 20 minutes.

Figure 13:
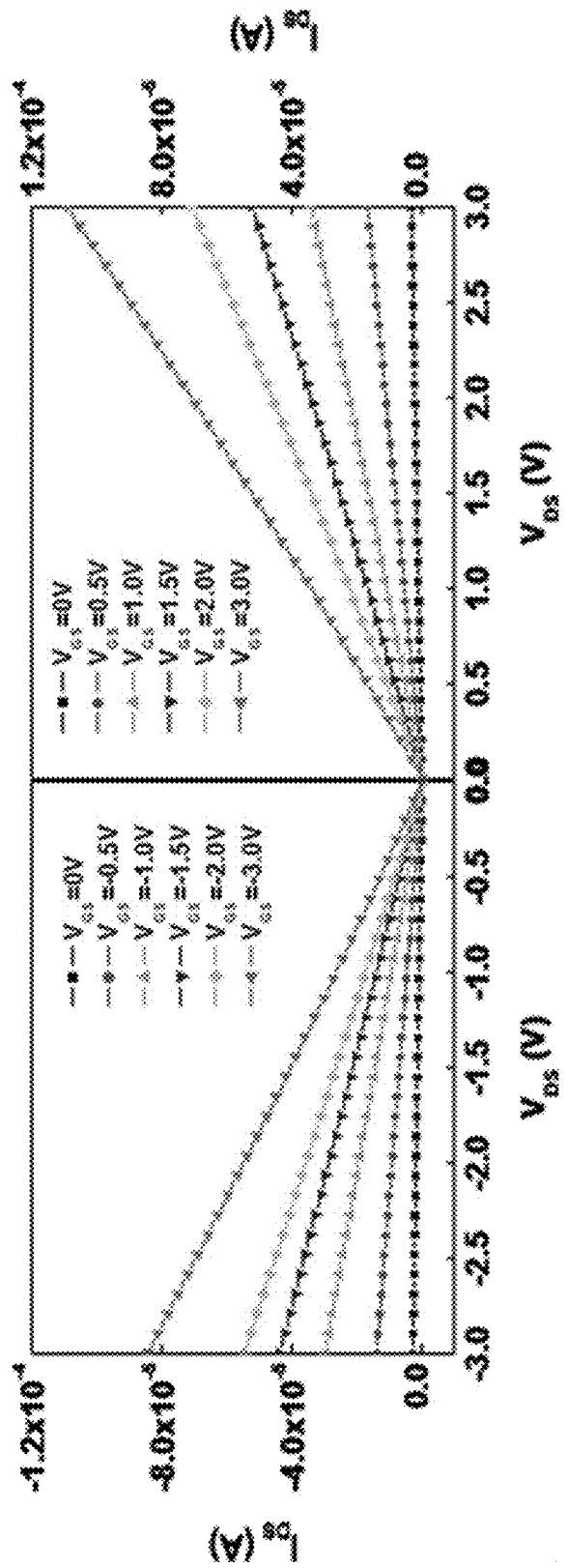
FIG. 13 shows a plot of the output characteristics of the [2,2'-$^e$bpy][Ni($L_2$)$_2$]$_2$-based thin film field-effect transistor.
Figure 14:
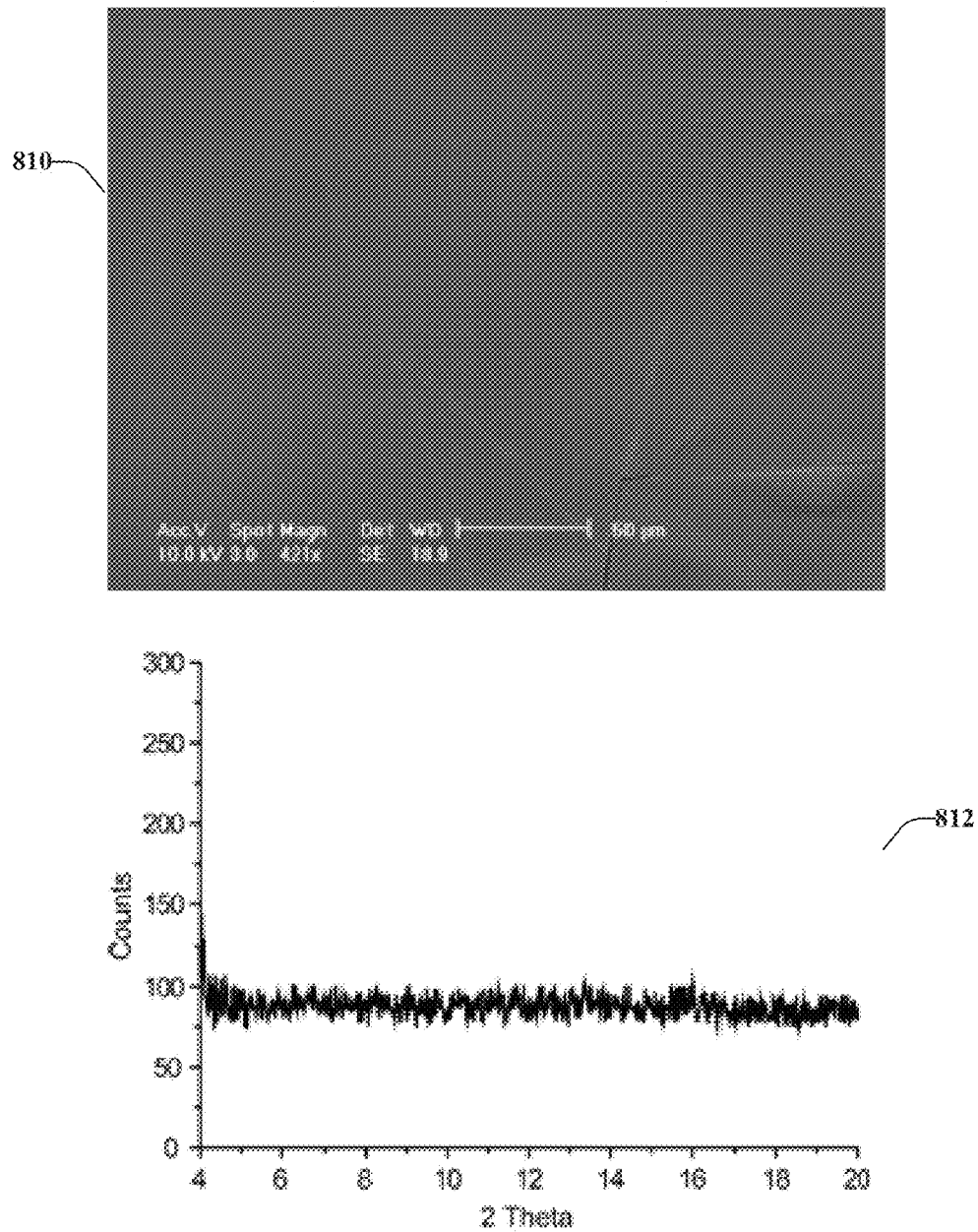
FIG. 14 shows a scanning electron microscopy (SEM) image and a grazing incidence X-ray powered diffraction (GIXRD) spectrum of a nickel CT complex.
Figure 15:
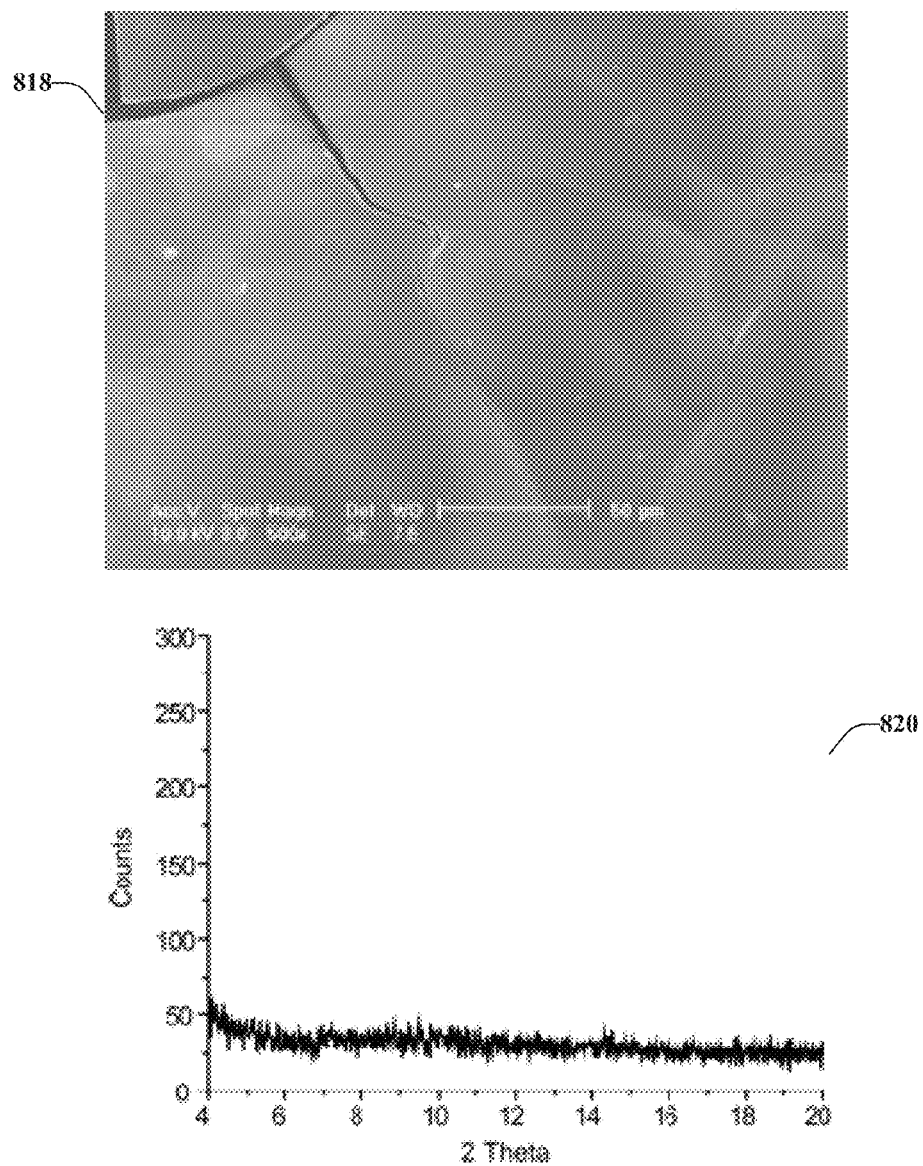
FIG. 15 shows a scanning electron microscopy (SEM) image and a grazing incidence X-ray powered diffraction (GIXRD) spectrum of a nickel CT complex.
Figure 16:
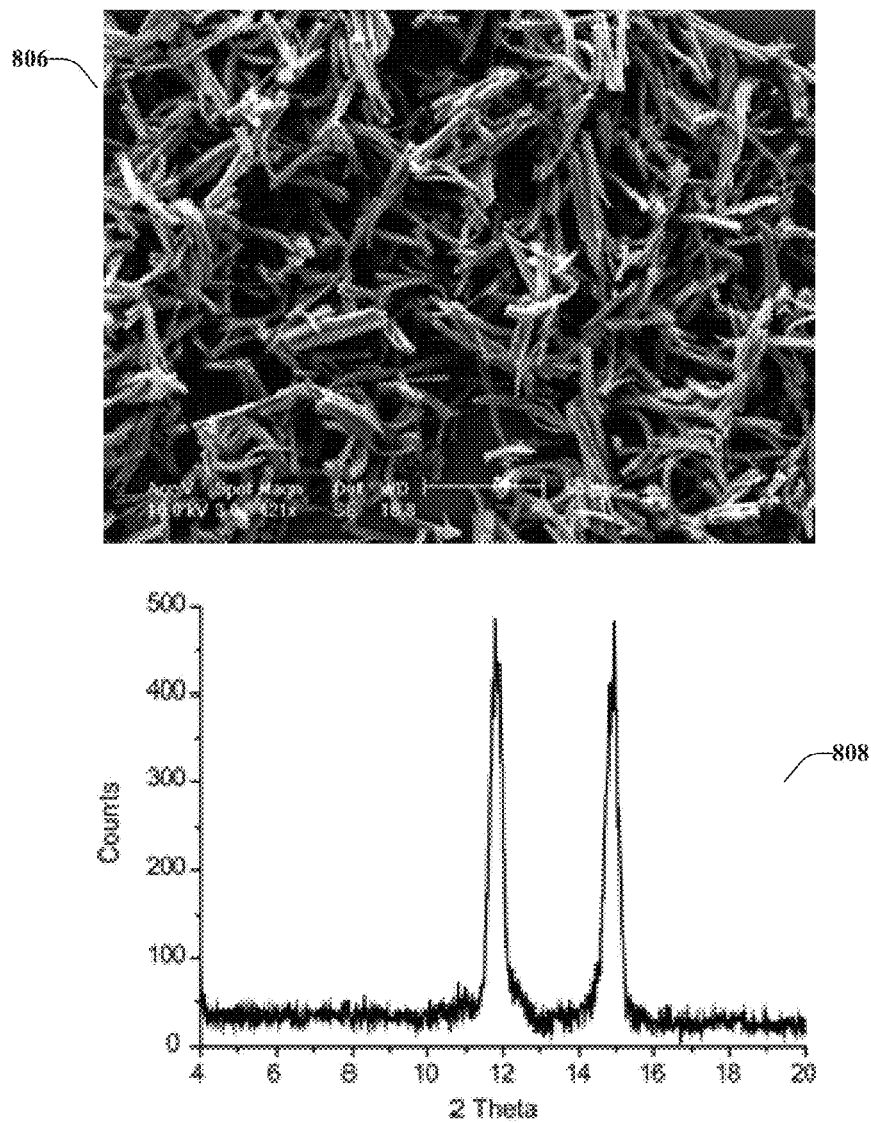
FIG. 16 shows a scanning electron microscopy (SEM) image and a grazing incidence X-ray powered diffraction (GIXRD) spectrum of a nickel CT complex.
Figure 17:
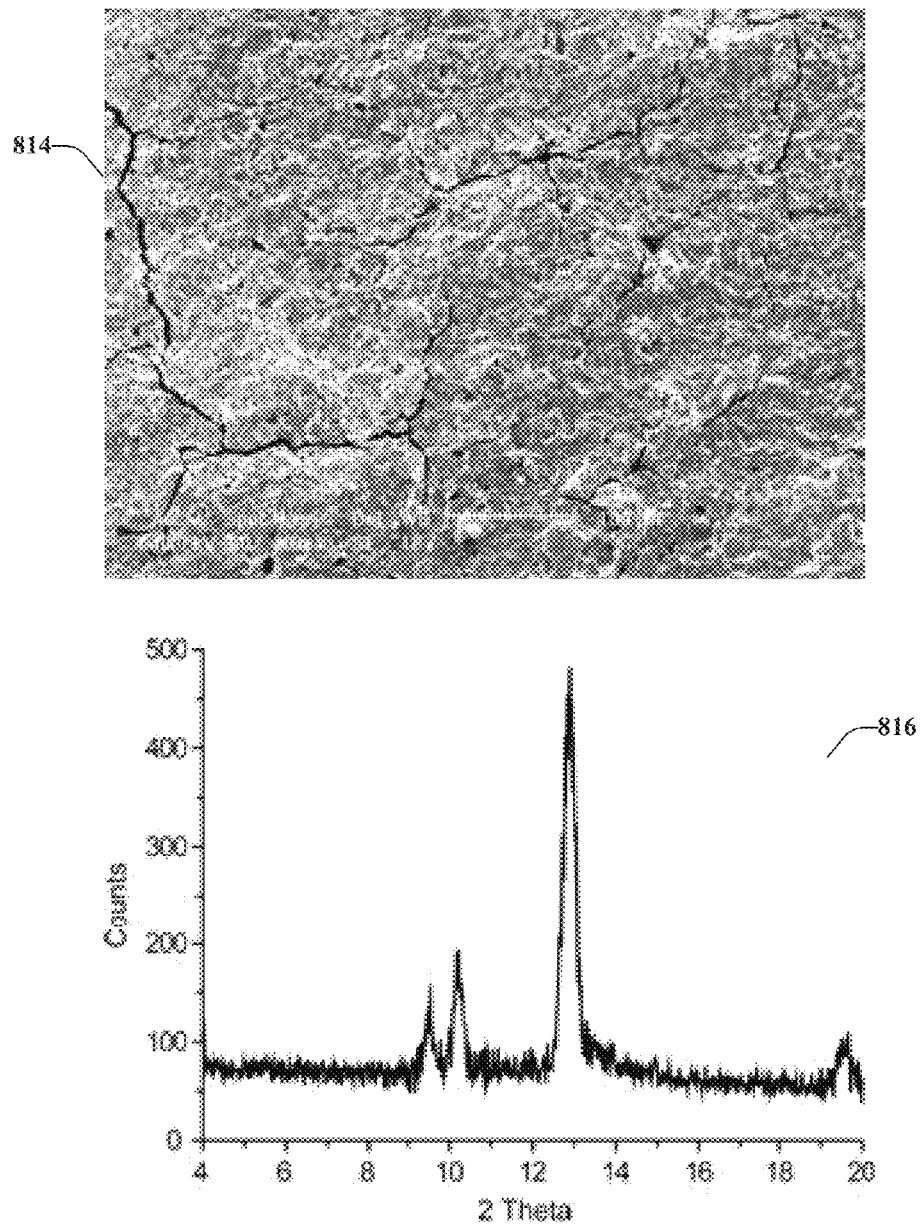
FIG. 17 shows a scanning electron microscopy (SEM) image and a grazing incidence X-ray powered diffraction (GIXRD) spectrum of a nickel CT complex.
Figure 18:
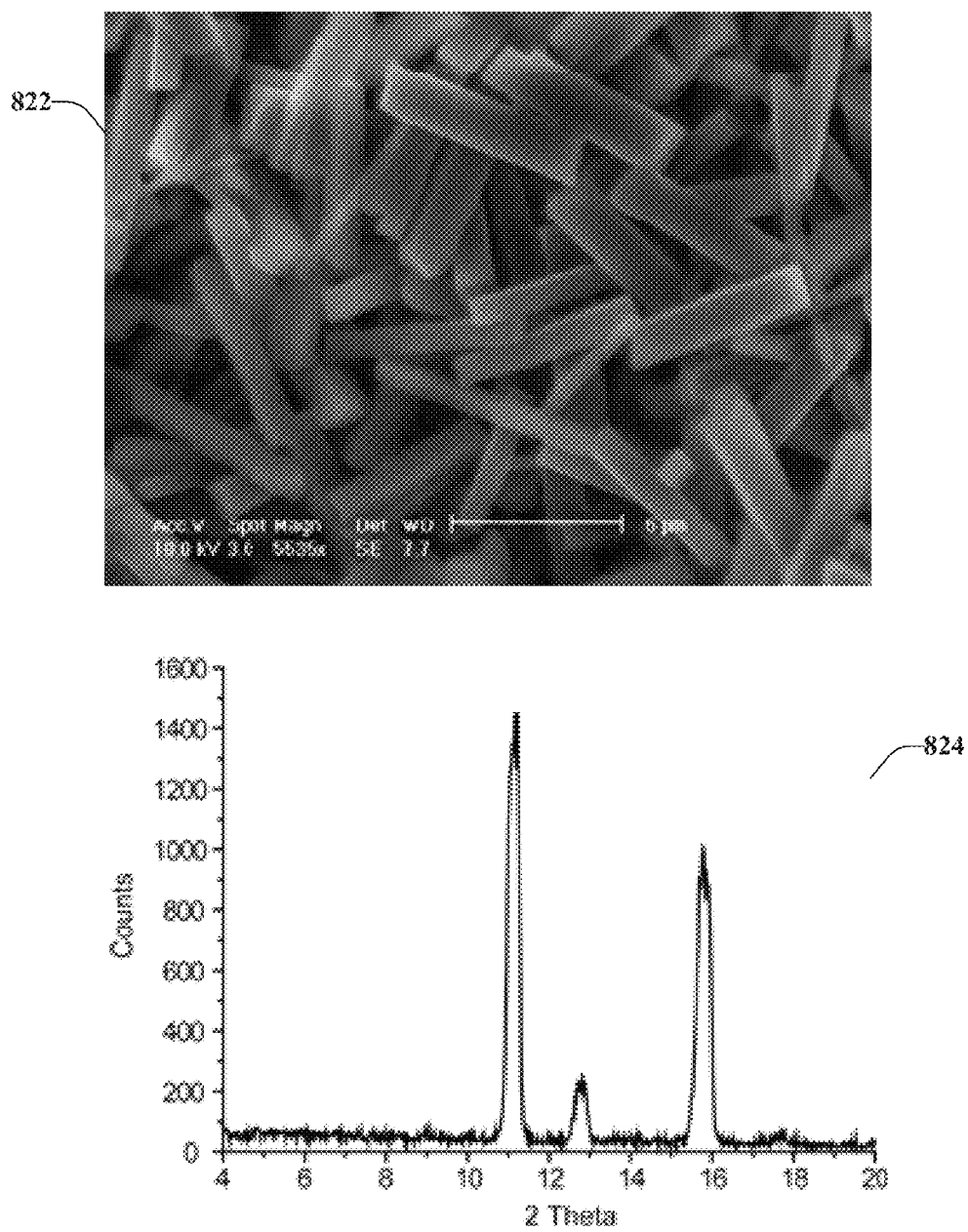
FIG. 18 shows a scanning electron microscopy (SEM) image and a grazing incidence X-ray powered diffraction (GIXRD) spectrum of a nickel CT complex.

For example, at element 1104, [2,2'-$^e$bpy][Ni(L₂)₂]₂ can be dissolved in DMF and, at element 1106, spin coated on a patterned ODPA/Al₂O₃/PET substrate. The output, transfer and transient characteristics of the as-fabricated [2,2'-$^e$bpy][Ni(L₂)₂]₂ thin film field-effect transistor were measured inside a N₂ glove box (Mbraun MB20G) equipped with a probe station connected to a semiconductor parameter analyzer (Keithley 4200 SCS). FIG. 13 shows a plot of the output characteristics of the [2,2'-$^e$bpy][Ni(L₂)₂]₂-based thin film field-effect transistor. The [2,2'-$^e$bpy][Ni(L₂)₂]₂thin film field-effect transistor exhibits both electron and hole properties. The field-effect charge mobility (μ) can be estimated from the output characteristics in the saturation region or linear region and was estimated as up to 0.1 cm²/Vs (channel length is 50 μm and channel width is 1000 μm).

The six nickel CT complexes have superior electrical properties to other CT complexes. The six nickel CT complexes provide comparatively high carrier mobility with respect to traditional nickel CT complexes. Through selection of the organic ligand and/or the organic counter-cation, the six nickel CT complexes are able to self-assemble in the active layer of semiconducting devices. This can increase the carrier concentration in the conduction band and, accordingly, provide high carrier mobility. Self-assembly has been previously shown with other organic-based CT complexes to increase carrier mobility. For example, charged cationic cyclometalated iridium(III) polypyridine complexes were electrostatically aligned in order for enhancing the carrier mobility; likewise self-assembled DNA nucleosides was used to fabricate high efficient hybrid molecular devices. The conductive properties of these devices are greatly influenced by their aligned structures, since the amorphous structure of those materials are behaved as insulators. In the six nickel CT complexes the organic ligand and/or the organic counter-cation provide similar benefits of self-assembly.

The six nickel CT complexes also have superior electrical properties to traditional organic CT complexes. Cation-anion interactions of inorganic based CT compounds, like the six nickel CT complexes described herein, are one of the key factors affecting their supramolecular packing and potential applications. Although purely organic charge-transfer salts exhibit interesting electronic and charge transport properties, the incorporation of metal centers into these materials leads to d-n interactions that enhance the electronic properties. Nickel CT complexes, for example, [Ni(dmit)₂]⁻, (dmit=2-thioxo-1, 3-dithiole-4,5-dithiolate), have previously been shown to form superconducting salts with both open- and closed-shell organic cations. A significant aspect of the solid-state interactions in this material is the overlap of the π-orbitals on the sulfur atoms with the metal d-orbitals that can enhance the electronic properties of the bulk material. Similarly, field-effect transistors fabricated with nickel bis(dithiolene) CT complexes have shown electron mobilities ranging from 3.0× 10⁻⁶ to 2.8 cmV⁻¹s⁻¹. Some nickel bis(dithiolene) CT complexes were also found to exhibit comparable FET hole mobility and the transistors have been used to fabricate complementary circuits. Additionally, depending on the type of nickel donors and accepting counterparts, the assembly may be conductors or magnets. Crystals of conducting nickel CT compounds comprise highly ordered arrays of donor and acceptor species, one or both of which must be a radical ion that is thermodynamically stable. Besides the interaction between the orbitals on neighboring molecules, the electrical properties of CT complex are also strongly dependent on its band gap, i.e., if the band gap is large, the material would be insulating, while if the band gap becomes small, electrons transitions from the valence band to the conduction band can be very effective by the thermal excitation, leading to the intrinsic semiconductivity.

The six nickel CT complexes described herein take advantage of the benefits of self-assembly seen in organic-based CT complexes and the benefits of cation-anion interactions seen in inorganic-based CT complexes. Therefore, the six nickel CT complexes can be utilized to make highly efficient semiconducting devices (e.g., thin-film field-effect transistors or inverters) easily and inexpensively. Both the process for synthesizing the six nickel CT complexes and the process for fabricating semiconductor devices utilizing the six nickel CT complexes are easy and inexpensive. Accordingly semiconducting devices (e.g., thin-film transistors or inverters) utilizing one of the six nickel CT complexes can be utilized in electrical applications. One such electrical application is low frequency radio frequency identification (RFID) tag. The processes described herein can be applied on a large scale for commercial production of RFID tags by printing one of the six nickel CT complexes on flexible substrates.

The embodiments as disclosed and described in the application are intended to be illustrative and explanatory, and not limiting. Modifications and variations of the disclosed embodiments, for example, of the processes and apparatuses employed (or to be employed) as well as of the compositions and treatments used (or to be used), are possible; all such modifications and variations are intended to be within the scope of this application.

What is claimed is:
1. A compound represented by the formula:

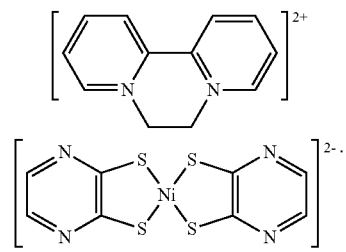

2. A method for synthesizing the compound of claim 1, comprising:
dissolving a first compound including a dianionic square planar complex of nickel and two neutral organic ligands of 2,3-pyrazinedithiol with a nickel center and a second compound including a counter-cation diquat in a solvent; and precipitating a complex including the dianionic square planar complex of nickel and two organic nickel ligands of 2,3-pyrazinedithiol and the counter-cation diquat.

3. A compound represented by the formula:

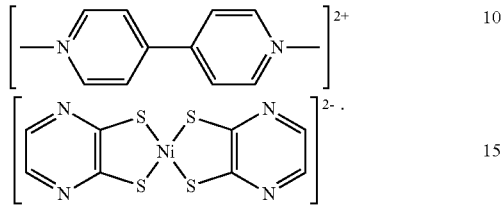

4. A method for synthesizing the compound of claim 3, comprising:

dissolving a first compound including a dianionic square planar complex of nickel and two neutral organic ligands of 2,3-pyrazinedithiol with a nickel center and a second compound including a counter-cation methyl viologen in a solvent; and precipitating a complex including the dianionic square planar complex of nickel and two organic nickel ligands of 2,3-pyrazinedithiol and the counter-cation methyl viologen.

* * * * *